(12) United States Patent
Hubbard et al.

(10) Patent No.: US 10,884,069 B2
(45) Date of Patent: Jan. 5, 2021

(54) CONTROL AREA NETWORK (CAN) BUS FAULT DETECTION

(71) Applicant: TEXAS INSTRUMENTS INCORPORATED, Dallas, TX (US)

(72) Inventors: Richard Edwin Hubbard, Allen, TX (US); Abhijeeth Aarey Premanath, Allen, TX (US); Terry Mayhugh, Richardson, TX (US); Mark Edward Wentroble, Plano, TX (US); Wesley Ryan Ray, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 157 days.

(21) Appl. No.: 16/101,213

(22) Filed: Aug. 10, 2018

(65) Prior Publication Data
US 2020/0049754 A1    Feb. 13, 2020

(51) Int. Cl.
*G01R 31/02* (2006.01)
*H04L 12/24* (2006.01)
(Continued)

(52) U.S. Cl.
CPC ......... *G01R 31/50* (2020.01); *G01R 19/2509* (2013.01); *H04L 41/0677* (2013.01);
(Continued)

(58) Field of Classification Search
CPC .. G01R 31/50; G01R 19/2509; G01R 31/006; G01R 31/005; G01R 31/007;
(Continued)

(56) References Cited

U.S. PATENT DOCUMENTS 5,781,585 A * 7/1998 Dorner .................. H04L 43/00
  327/64
6,115,831 A * 9/2000 Hanf ................. B60R 16/0315
  714/43
(Continued)

FOREIGN PATENT DOCUMENTS

CN    202703453    1/2013
CN    203206272    9/2013

OTHER PUBLICATIONS

Obmen Dannimi Posredstvom Shini Can II. Posobie Po Progpamme Samoobrazovanij No. 269 (retrieved on Mar. 28, 2017) Retrieved from Oct. 23, 2019 <http://help4auto.com/download/ssp.269_Obmen%20dannymi%20posredstvom%20shiny%20CAN%2011.PDF> (5 pages). No English translation provided.

(Continued)

*Primary Examiner* — Lee E Rodak
(74) *Attorney, Agent, or Firm* — John R. Pessetto; Charles A. Brill; Frank D. Cimino

(57) ABSTRACT

A CAN bus transceiver includes CAN bus fault detection circuitry that can provide detailed information to simplify the task of the service technician when there is a CAN bus fault. Voltage and current measurements of the CAN bus are made and from them a fault type is determined. A time-domain reflectometer monitors the CAN bus signals for transmitted and reflected signals and from them a distance to the fault is determined. Either or both values are provided to a service technician to allow error determination and correction.

20 Claims, 22 Drawing Sheets

(51) Int. Cl.
  *G01R 19/25* (2006.01)
  *G01R 31/50* (2020.01)
  *H04L 12/40* (2006.01)

(52) U.S. Cl.
  CPC .... *H04L 41/0686* (2013.01); *H04L 12/40169* (2013.01); *H04L 2012/40215* (2013.01)

(58) Field of Classification Search
  CPC .............. G01R 31/021; G01R 31/2829; G01R 31/2848; G01R 31/52; G01R 31/58; G01R 31/024; G01R 31/025; G01R 31/026; G01R 31/3004; G01R 31/54; H04L 41/0677; H04L 41/0686; H04L 2012/40215; H04L 12/40169; H04L 12/40006; H04L 12/423; H04L 1/24; H04L 2012/40273; H04L 43/0811; H04L 43/0823; H04L 43/50; H04L 69/40; G06F 11/3013; G06F 11/0736; G06F 11/079; G06F 11/221; G06F 11/3041; G06F 11/3055; G06F 11/349; G06F 11/0739; G06F 11/0754; G06F 17/5036; G06F 2119/10; G06F 2217/82; G06F 30/367
  See application file for complete search history.

(56) References Cited

U.S. PATENT DOCUMENTS

| | | | |
|---|---|---|---|
| 6,473,871 B1 * | 10/2002 | Coyle | .................. G06F 11/221 714/715 |
| 6,691,056 B2 * | 2/2004 | Muth | .................. G06F 13/4068 702/122 |
| 8,935,040 B2 * | 1/2015 | Julson | .................. H04L 41/064 701/29.8 |
| 2018/0181743 A1 * | 6/2018 | Hofman | .................. G06F 21/55 |

OTHER PUBLICATIONS

International Search Report in corresponding PCT Application No. PCT/US2019/046189, dated Oct. 31, 2019 (2 pages).

* cited by examiner

FAULT 3

FAULT 4

FAULT 4

FAULT 5

FAULT 5

FAULT 6

FAULT 7

FAULT 8

FAULT 9

FAULT 10

FAULT 11

| FAULT | $V_{DIFF}$ (V) | $I_{DIFF}$ (mA) | $V_{DIFF}$ V3 | V2 | V1 | $I_{DIFF}$ I2 | I1 | CODE |
|---|---|---|---|---|---|---|---|---|
| 0 | 0.9V TO 2.48V | -24mA TO +24mA | 0 | 0 | 1 | 0 | 1 | 0 |
| 1 | 2.48V TO 2.95V | -24mA TO +24mA | 0 | 1 | 1 | 0 | 1 | 1 |
| 2 | >2.95V | -24mA TO +24mA | 1 | 1 | 1 | 0 | 1 | 245 |
| 3 | <0.9V | -24mA TO +24mA | 0 | 0 | 0 | 0 | 1 | 3 |
| 4 | >2.95V | -24mA TO +24mA | 1 | 1 | 1 | 0 | 1 | 245 |
| 5 | >2.95V | -24mA TO +24mA | 1 | 1 | 1 | 0 | 1 | 245 |
| 6 | >2.95V | <-24mA | 0 | 0 | 1 | 1 | 1 | 6 |
| 7 | <0.9V | >+24mA | 0 | 0 | 0 | 0 | 0 | 710 |
| 8 | <0.9V | <-24mA | 0 | 0 | 0 | 1 | 1 | 811 |
| 9 | >2.95V | >+24mA | 1 | 1 | 1 | 0 | 0 | 9 |
| 10 | <0.9V | >+24mA | 0 | 0 | 0 | 0 | 0 | 710 |
| 11 | <0.9V | <-24mA | 0 | 0 | 0 | 1 | 1 | 811 |

FIG. 10

CONTROL AREA NETWORK (CAN) BUS FAULT DETECTION

BACKGROUND

1. Field

The present design relates to automotive systems, and more particularly to controller area network (CAN) bus environments.

2. Description of the Related Art

CAN bus environments, be it a vehicle or an industrial facility, can be very harsh and CAN bus faults, such as open or shorted lines or lines faulted to battery voltage or ground, are not uncommon. However, current CAN bus transceivers have little to no fault detection capabilities. If there is no fault detection capability, a service technician must somehow figure out that there is a fault and then must tediously check connections and wiring for the possible fault. Even the CAN bus transceivers that have fault detection capability provide nothing more than a fault indication, still requiring the laborious checking process.

SUMMARY

A CAN bus transceiver includes CAN bus fault detection circuitry that can provide detailed information to simplify the task of the service technician when there is a CAN bus fault. Voltage and current measurements of the CAN bus are made and from them a fault type is determined. A time-domain reflectometer monitors the CAN bus signals for transmitted and reflected signals and from them a distance to the fault is determined. Either or both values are provided to a service technician to allow error determination and correction.

BRIEF DESCRIPTION OF THE FIGURES

For a detailed description of various examples, reference will now be made to the accompanying drawings in which:

FIG. 10 is a table summarizing the conditions of the faults of FIGS. 2A-2O and the output code.

DETAILED DESCRIPTION

Figure 1A:
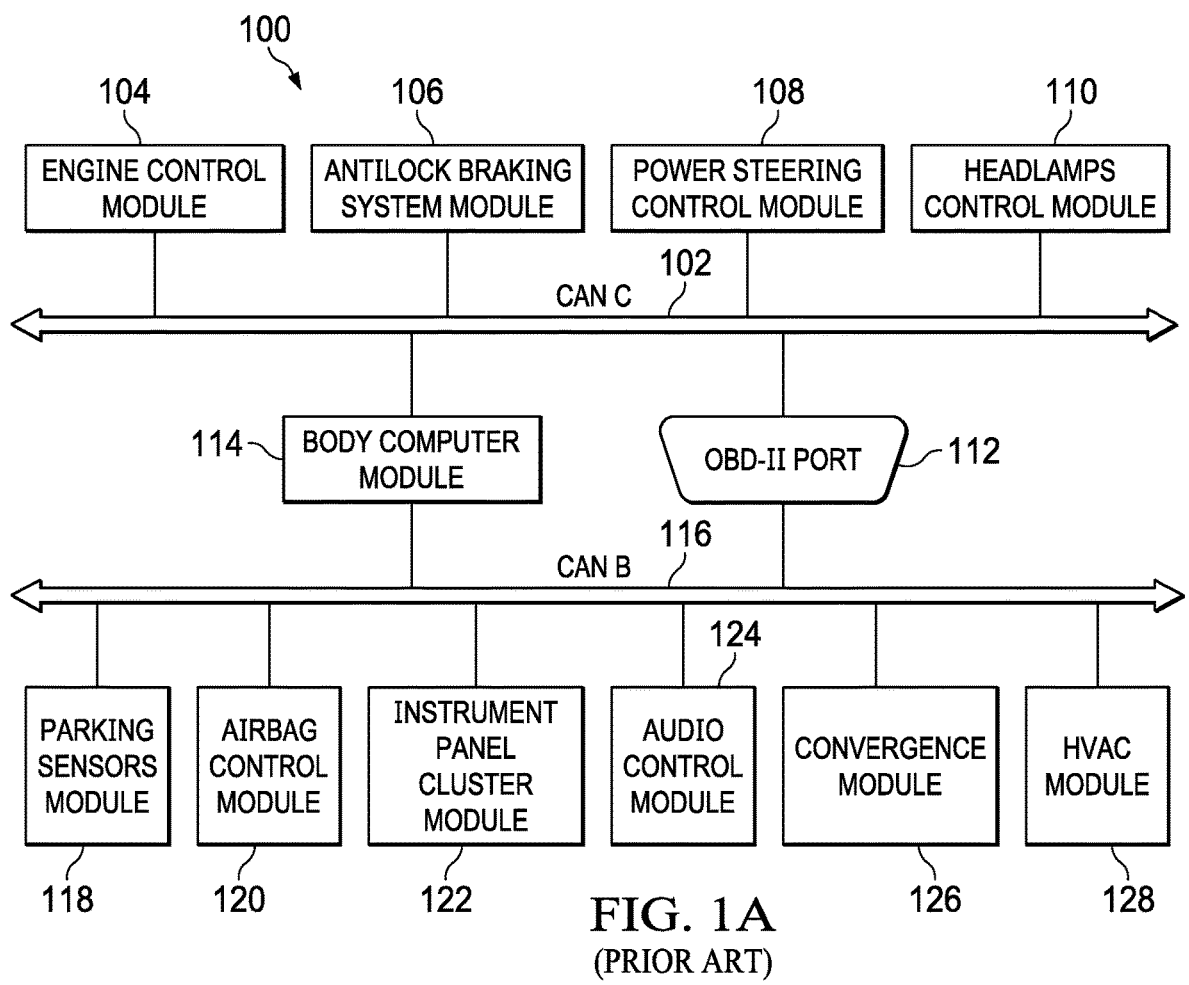
FIG. 1A is a block diagram of the control systems of an automobile.

Referring now to FIG. 1A, a block diagram of the control system 100 of an automobile is illustrated. A CAN bus 102 in mode C has connected to it an engine control module 104, an antilock braking system module 106, a power steering control module 108, a headlamps control module 110, an OBD-II port 112 and a body computer module 114. A CAN bus 116 in mode B is connected to the OBD-II port 112 and the body computer module 114 and has connected to it a parking sensors module 118, an airbag control module 120, an instrument contact panel cluster module 122, an audio control module 124, a convergence module 126 and an HVAC module 128. It is understood that these are just exemplary modules and additional modules or fewer modules could be present in a particular car, as could more or less CAN buses or alternative or additional buses.

Figure 1B:
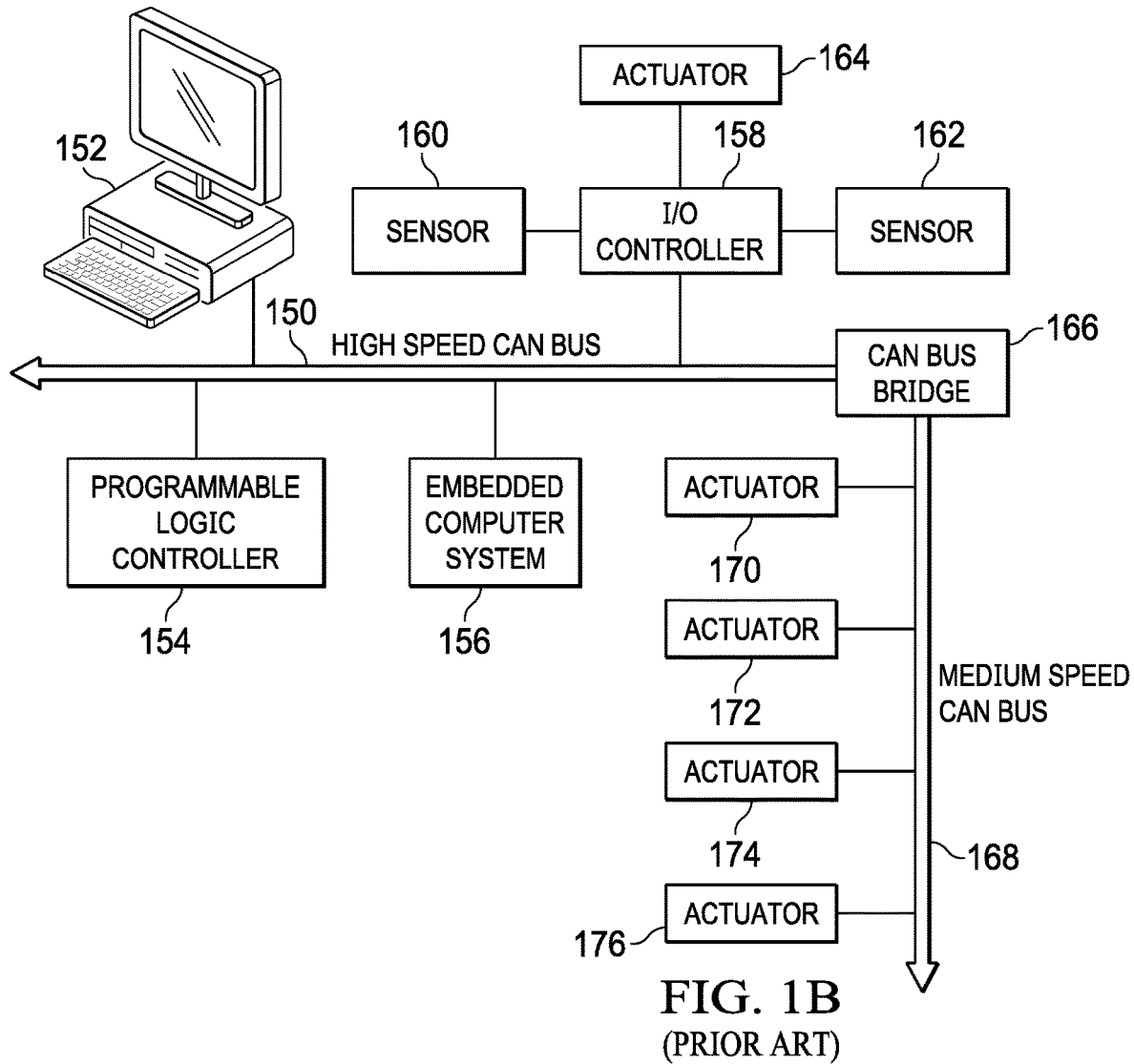
FIG. 1B is a block diagram of an industrial automation system.

FIG. 1B is a block diagram of an industrial automation system according to the prior art. While automobiles may be the best known and most widespread use of the CAN bus, CAN buses are used in industrial and residential environments as well. Indeed, the industrial and residential environments are more likely to have reversed CAN bus connections than the automotive environment because of the need to individually connect each CAN bus controller. A high speed CAN bus 150 forms the interconnect between a personal computer 152, a programmable logic controller (PLC) 154, an embedded computer system 156 and an input/output controller 158. Sensors 160, 162 are connected to the input/output controller 158, as is an actuator 164. The sensors 160, 162 and actuator 164 are conventional and cannot be connected directly to a CAN bus. A CAN bus bridge 166 is connected to the high speed CAN bus 150 and provides a medium speed CAN bus 168. Actuators 170, 172 and sensors 174, 176 are directly connected to the medium speed CAN bus 168. This configuration allows the personal computer 152 to program the PLC 154 and the embedded computer system 156. The PLC 154 and the embedded computer system 156 run the control algorithms used to automate the industrial environment or the home.

Figure 2:
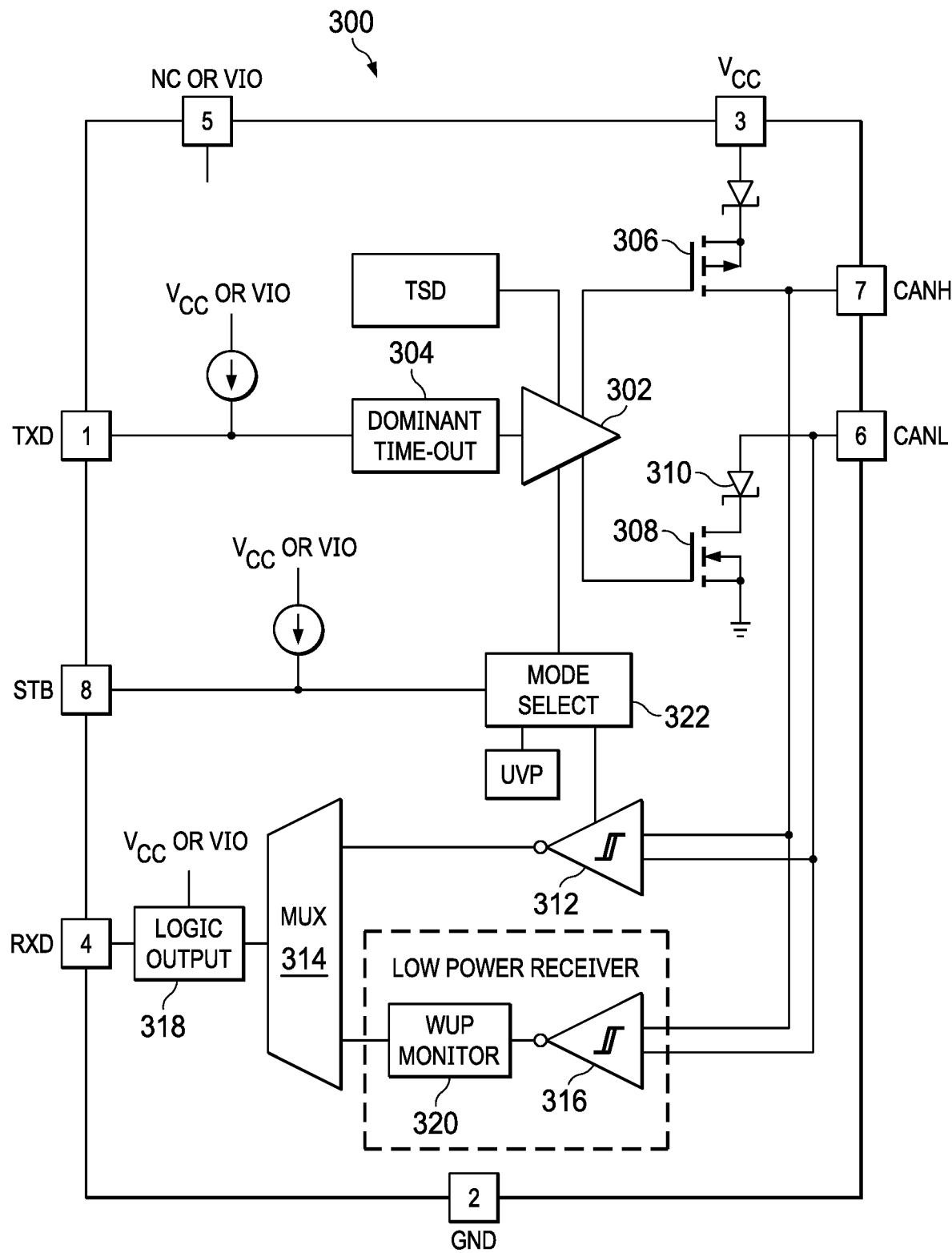
FIG. 2 is a block diagram of a CAN bus transceiver.

FIG. 2 is a block diagram of a CAN bus transceiver integrated circuit 300, such as the TCAN1042 from Texas Instruments® according to the prior art. The transceiver integrated circuit 300 is contained in an eight pin integrated circuit. An output driver 302 receives its input from a dominant timeout block 304. The dominant timeout block 304 prevents the driver 302 from providing a continuous dominant signal to the CAN bus, which would interfere with operations on the CAN bus. The dominant timeout block 304 is connected to a transmit data or TXD input pin of the transceiver integrated circuit 300. The high or positive output of the driver 302 is connected to a P-channel MOSFET (metal-oxide-semiconductor field-effect transistor) 306, which is connected to a High CAN bus pin or CANH.

The low or negative output of the driver 302 is connected to an N-channel MOSFET 308, which is connected through a protection diode 310 to a Low CAN bus pin or CANL. A differential receiver 312 has its inputs connected to the CAN bus high and Low CAN bus pins and its output connected to one input of a multiplexer 314. A low-power differential receiver 316 also has its inputs connected to the CAN bus high and CAN bus low pins and has its output connected to a Wake up Pattern (WUP) monitor block 320. The WUP monitor block 320 monitors signals that are present on the CAN bus to detect that a signal is present so that the transceiver integrated circuit 300 can exit standby mode and enter normal or operational mode. The output of the WUP monitor block 320 is connected to a second input of the multiplexer 314. The output of the multiplexer 314 is provided to a logic output level block 318, whose output is connected to a receive data or RXD pin of the transceiver integrated circuit 300. A standby or STB input is provided to a mode select block 322. When the standby signal is at a high state, the transceiver integrated circuit 300 is in a low-power or standby mode, with only the low-power differential receiver 316 and WUP monitor block 320 active. The driver 302 and the receiver 312 are in a powerdown condition. The mode select block 320 has outputs to the driver 302 and the receiver 312 to place them in their low-power condition.

Figure 2A:
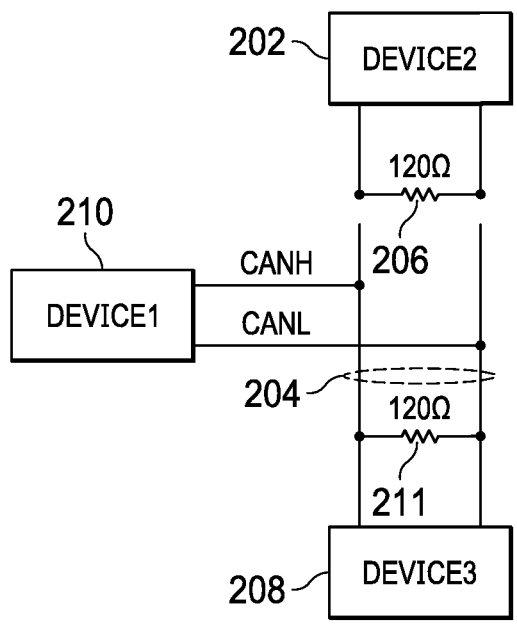
FIGS. 2A-2O are block diagrams indicating fault conditions.
Figure 2B:
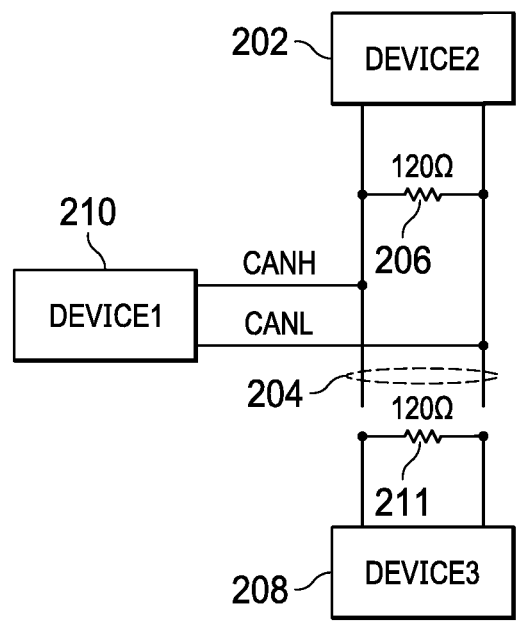
FIG. 2P is a waveform illustration of waveforms on the CAN bus for a transmitter at a termination point.
FIG. 2Q is a waveform illustration of waveforms on the CAN bus for a transmitter at an intermediate location.
Figure 2C:
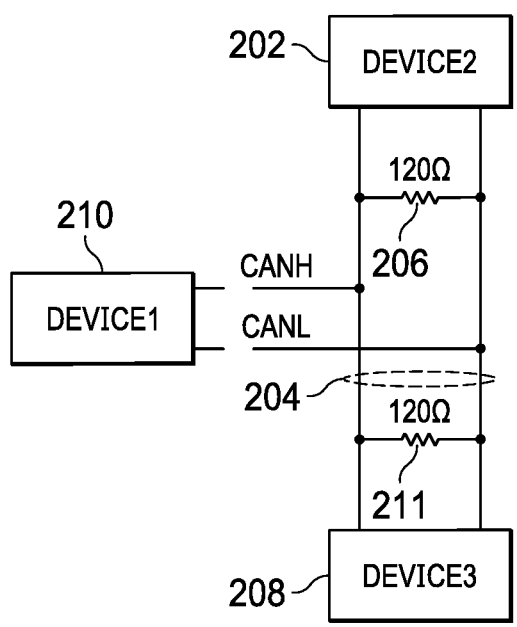
Figure 2D:
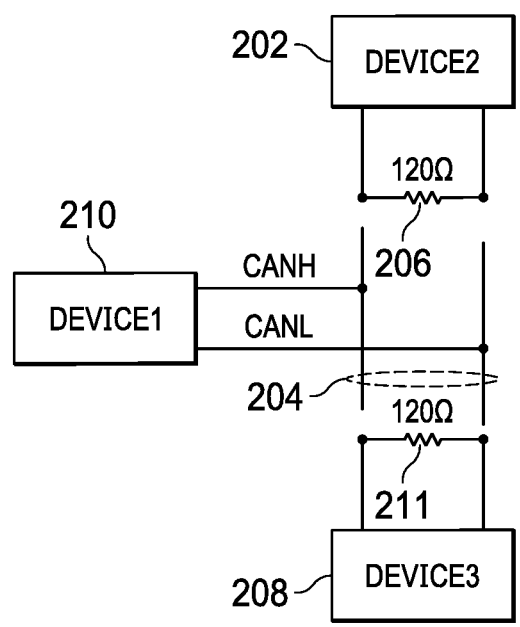
Figure 2E:
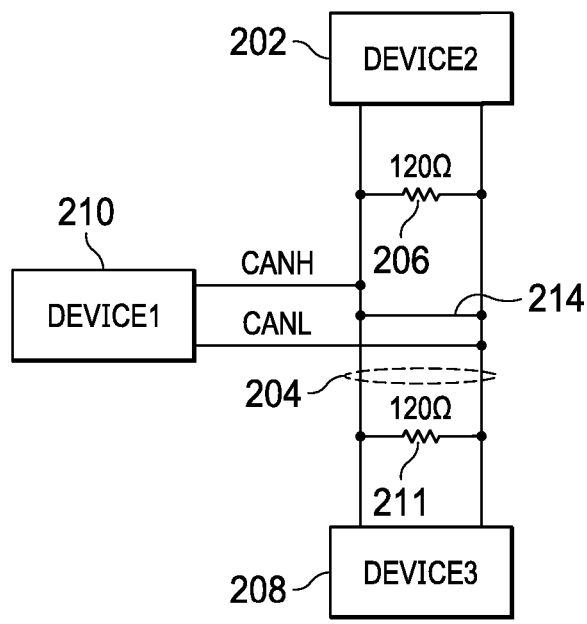
Figure 2F:
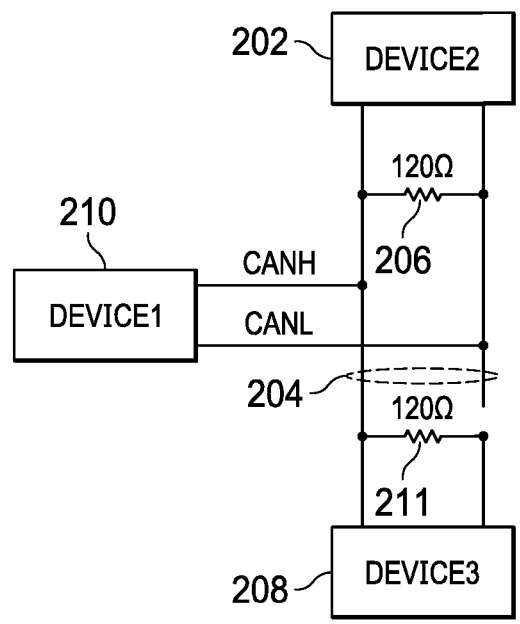
Figure 2G:
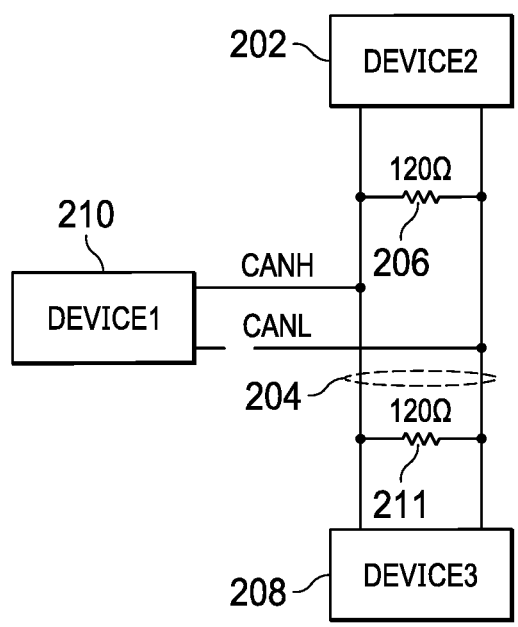
Figure 2H:
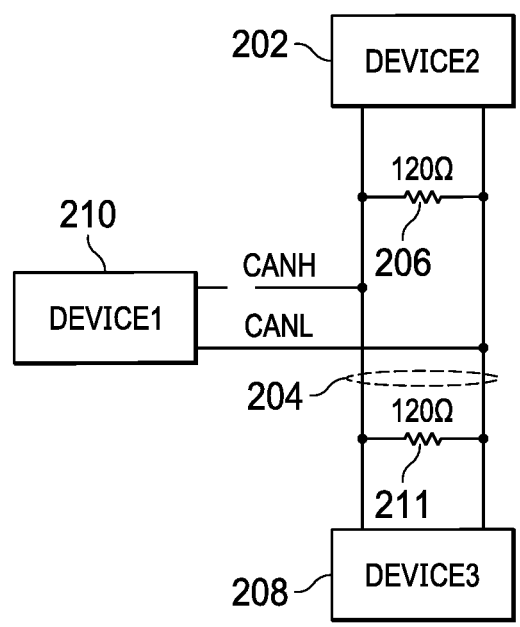
Figure 2I:
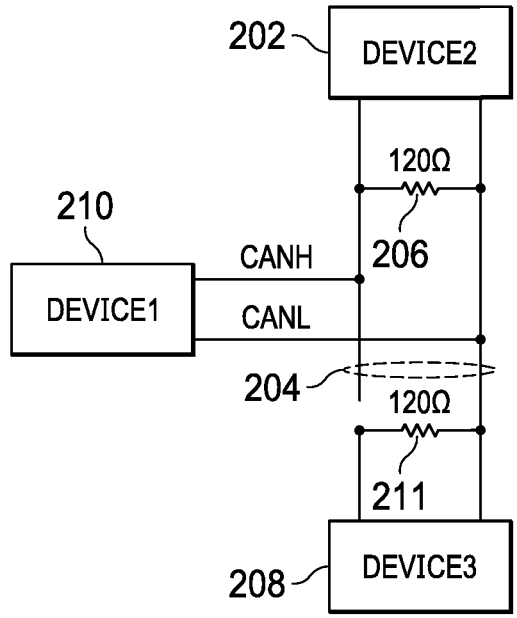
Figure 2J:
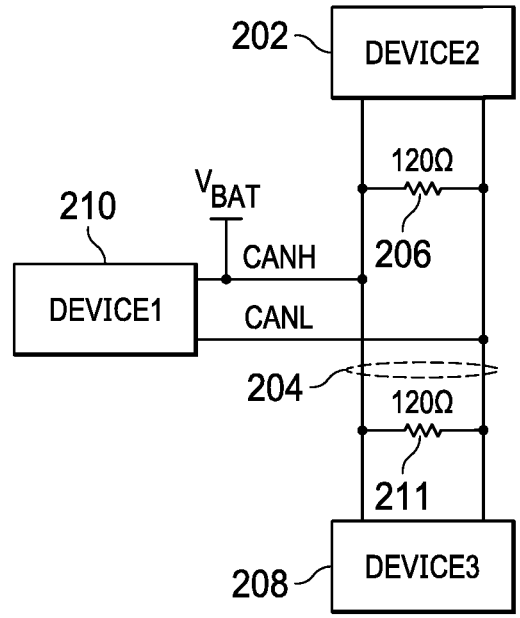
Figure 2K:
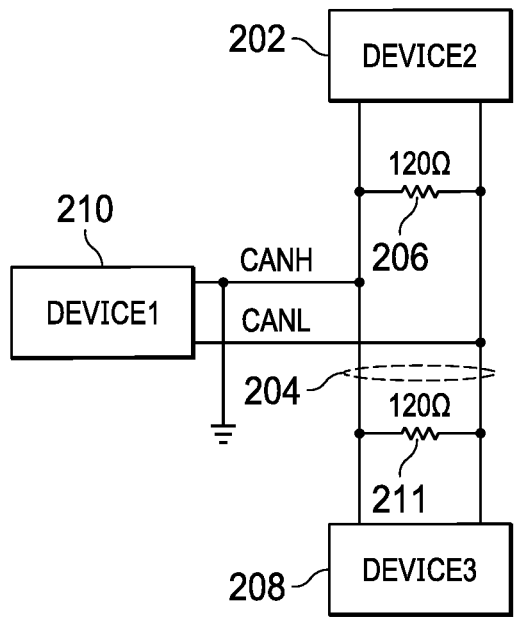
Figure 2L:
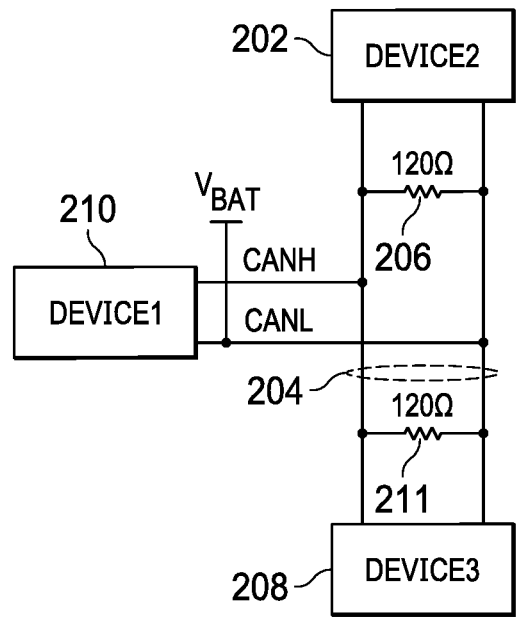
Figure 2M:
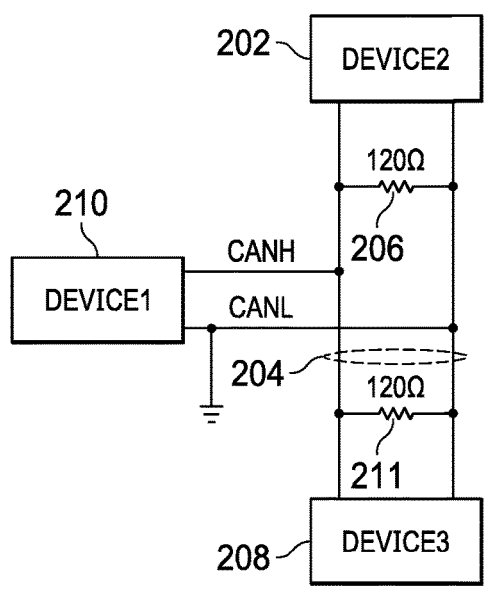
Figure 2N:
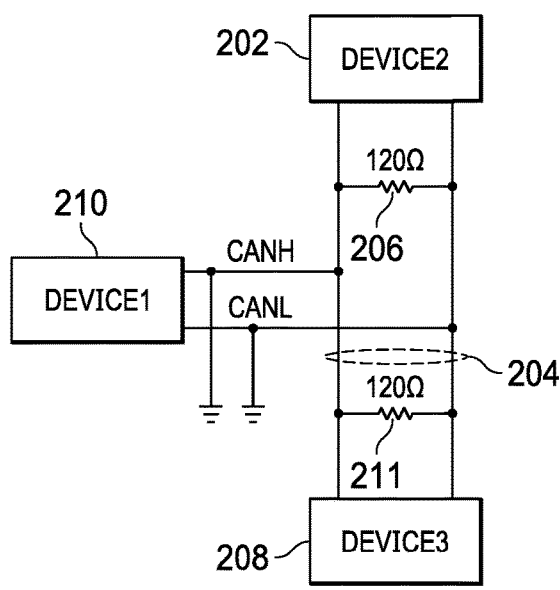
Figure 2O:
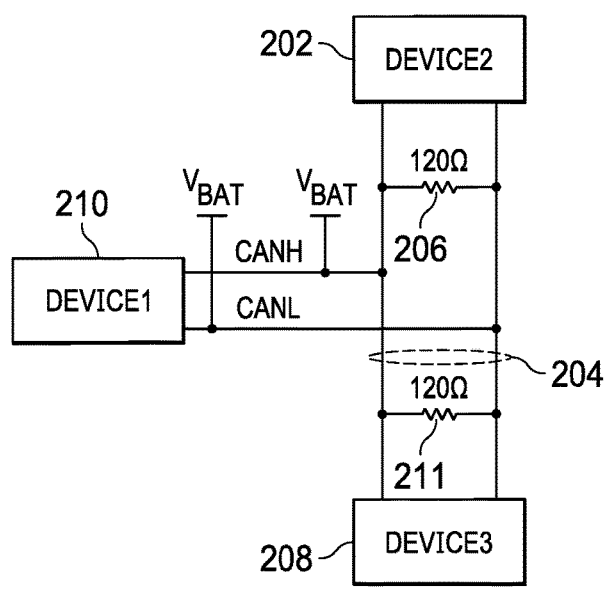

Referring now to FIGS. 2A to 2O, various fault conditions are illustrated. In FIG. 2A a device2 202 is at one end of a CAN bus 204 with a termination resistor 206. Device3 208 and a termination resistor 211 are located the other end of the CAN bus 204. A device5 210 is connected to the CANH and CANL lines of the CAN bus 204. In FIG. 2A, the CAN bus 204 is open on both the CANH and CANL lines just before the termination resistor 206 by the device2 202. This is an open CAN bus and is considered to be a fault one condition. FIG. 2B shows a second alternative of a fault one condition where the CAN bus 204 is open just before the termination resistor 211. FIG. 2C illustrates a third variant of a fault one condition, in this case the two lines CANH and CANL to the CAN bus 204 from device1 210 are open.

FIG. 2D illustrates a fault 2 condition and in this case the CAN bus 204 is open before both the termination resistor 206 and the termination resistor 211 so that the CAN bus 204 is completely unterminated. A fault 3 condition is illustrated in FIG. 2E, where a short 214 is present between the CANH and CANL lines of the CAN bus 204. FIG. 2F illustrates a fault 4 condition and in this case the CANL line of the CAN bus 204 is open just before the termination resistor 211. A second fault 4 condition is illustrated in FIG. 2G. In FIG. 2G the CANL line from the device1 210 to the CAN bus 204 is open.

FIG. 2H illustrates a first variant of a fault 5 condition. The CANH line from device1 210 to the CAN bus 204 is open. A second variation of a fault 5 condition is illustrated in FIG. 2I, where the CANH line of the CAN bus 204 is open before the termination resistor 210.

A fault 6 condition is illustrated in FIG. 2J, where the CANH line from device1 210 is connected to $V_{BAT}$. A fault 7 condition is shown in FIG. 2K, in this instance the CANH line from device1 210 is connected to ground before the CAN bus 204. FIG. 2L illustrates a fault 8 condition where the CANL line from device1 210 is connected to $V_{BAT}$. A fault 9 condition illustrated in FIG. 2M has the CANL line from device1 210 connected to ground before the CAN bus 204.

A fault 10 condition is illustrated in FIG. 2N, where both the CANH and CANL lines from the device1 210 are connected to ground before the CAN bus 204. A fault n condition is similar as shown in FIG. 2O, except the CANH and CANL lines are connected to $V_{BAT}$ before the CAN bus 204.

Figure 2P:
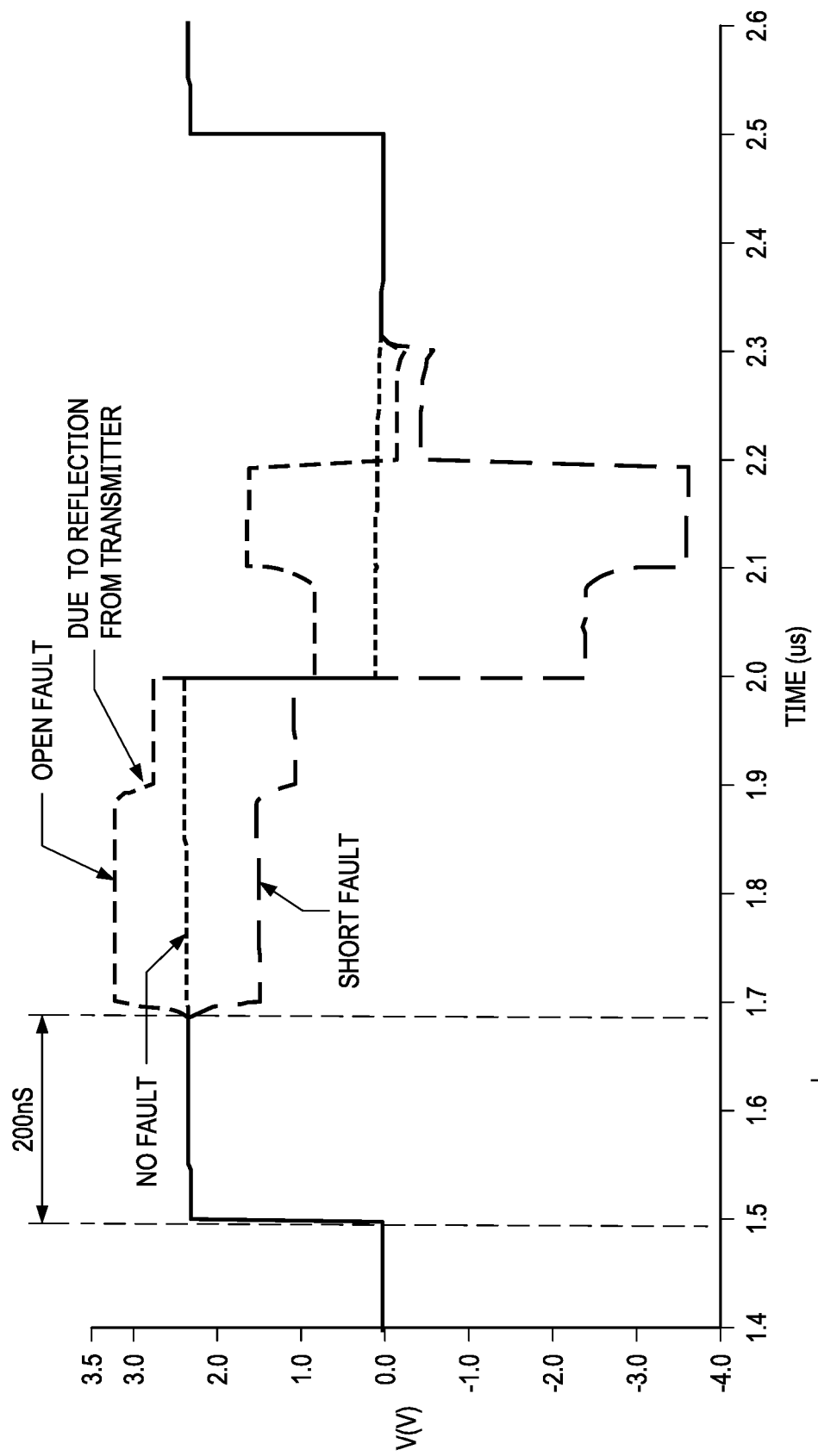
Figure 2Q:
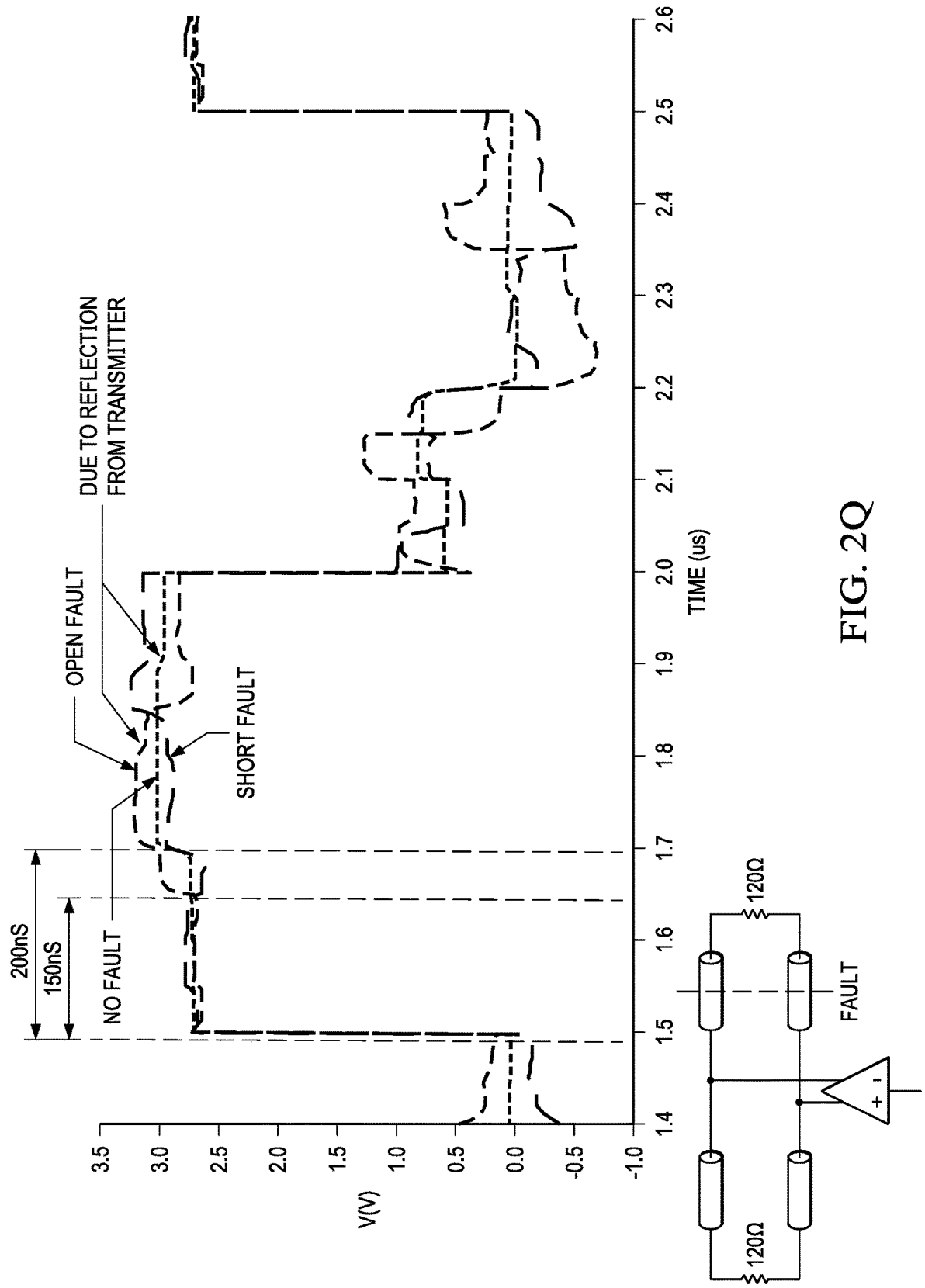

FIG. 2P illustrates example CAN bus waveforms when the CAN bus driver is located at a termination point as illustrated. As can be seen, the waveforms are different for an open fault, a short fault and no fault. FIG. 2Q is a similar waveform drawing for the case where the CAN bus driver is located between the termination points, in a stub configuration. As can be seen, there are also characteristic waveforms for open fault, short fault and no fault, though they vary from the waveforms of FIG. 2P.

Figure 3:
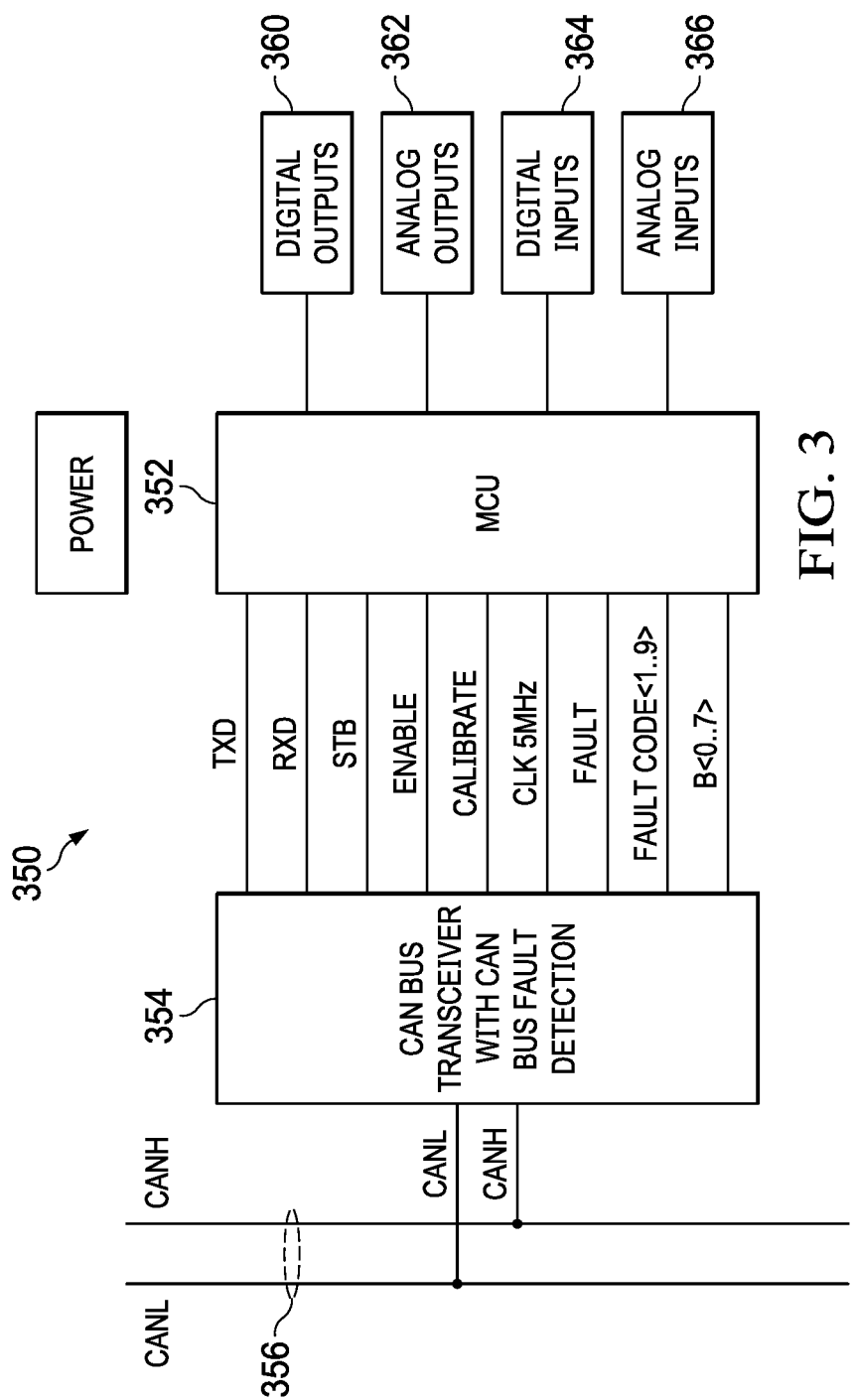
FIG. 3 is a block diagram of a CAN bus controller.

FIG. 3 is a block diagram of an exemplary CAN bus controller 350. A microcontroller (MCU) 352 is the controlling device. The MCU 352 is connected to a CAN bus transceiver with an embedded CAN bus fault detection module 354, which is connected to a CAN bus 356. TXD, RXD and STB signals connect the MCU 352 and the CAN bus transceiver with an embedded CAN bus fault detection module 354 for the normal CAN bus transceiver functions. ENABLE, CALIBRATE and CLK5MHz signals are provided from the MCU 352 to the CAN bus transceiver with an embedded CAN bus fault detection module 354. The CAN bus transceiver with an embedded CAN bus fault detection module 354 provides various FAULT codes and a B<0 . . . 7> to the MCU 352 to provide fault information and timing values. The CAN bus fault detection module is described in more detail below. Various digital outputs 360, analog outputs 362, digital inputs 364 and analog inputs 366 are connected to the MCU 352. It is understood that this is a very simplistic controller block diagram provided for explanatory purposes.

Figure 4:
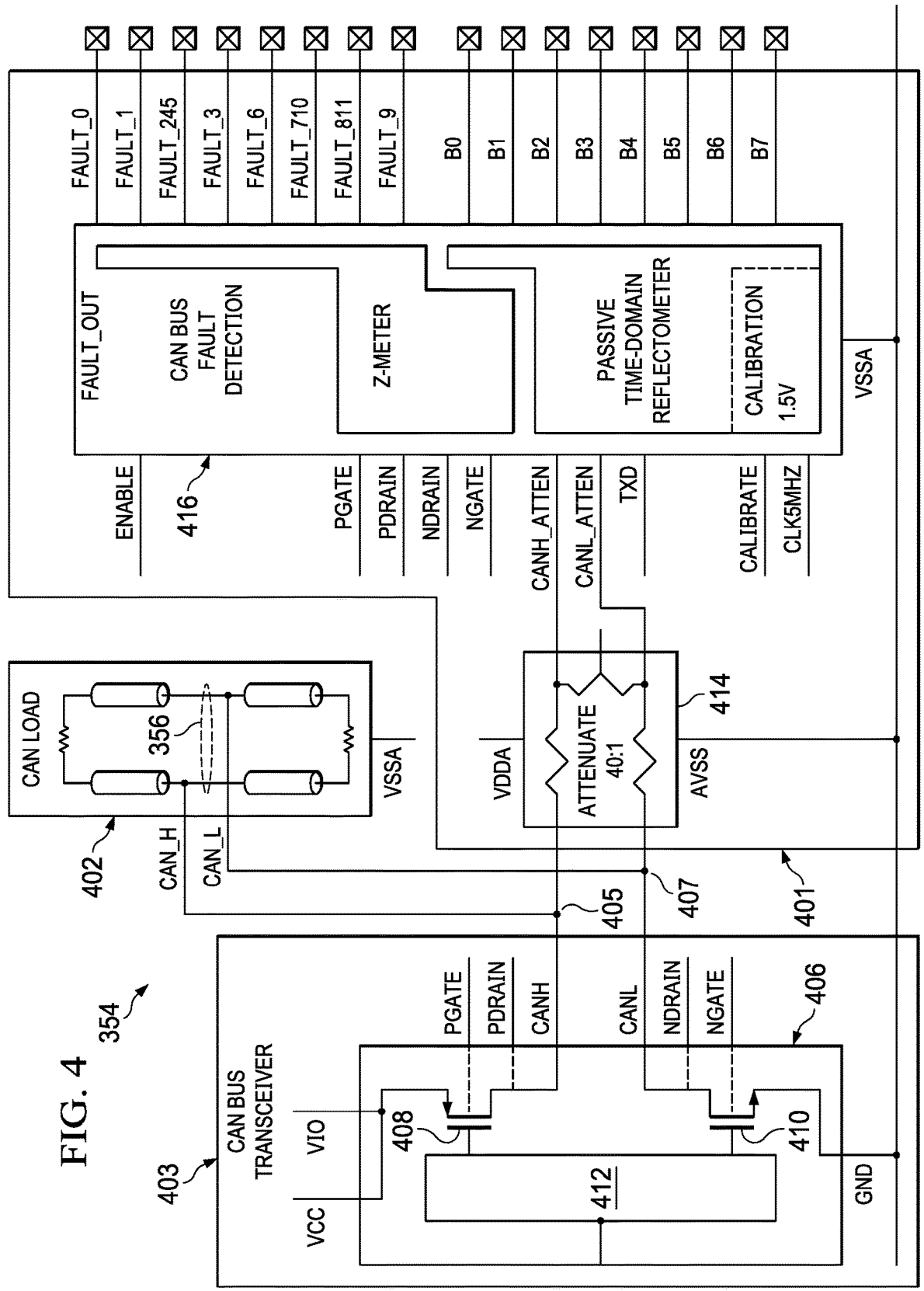
FIG. 4 is a block diagram of the CAN bus fault detection module of FIG. 3.

FIG. 4 is a block diagram of a first design for the CAN bus transceiver with an embedded CAN bus fault detection module 354. A CAN bus 356 is illustrated with exemplary termination resistors 402 and 404. A CAN bus transceiver 403, such as the CAN bus transceiver 300 of FIG. 2, is connected to the CAN bus 356 using CANH and CANL pins 405 and 407, respectively. A CAN bus fault detection module 401, contained on the same integrated circuit as the CAN bus transceiver 403 in one design, is also connected to the CAN bus 356 and to the CAN bus transceiver 403. The design of FIG. 4 has the CAN bus fault detection module 401 connected in a stub configuration to the CAN bus 356. Output drive circuitry 406 of the CAN bus transceiver 403 is connected to the CAN bus 356. In the output drive circuitry 406, a P-channel enhancement mode MOSFET 408, equivalent to the MOSFET 306, has the drain connected to the CANH line, the source connected to $V_{CC}$ and the gate connected to the preceding driver circuitry 412. Signals PGATE and PDRAIN are provided from the gate and drain of the MOSFET 408. An N-channel enhancement MOSFET 410, equivalent to MOSFET 308, has the source connected to ground, the drain connected to the CANL line of the CAN bus 356 and the gate connected to preceding driver circuitry 412. NDRAIN and NGATE signals are provided to allow monitoring of the MOSFET 410.

An attenuator 414 is connected to the CANH and CANL lines of the CAN bus 356. In one design the attenuator 414 has a 403 attenuation so that potential voltage spikes are removed. A CAN bus fault detection circuit 416 receives the attenuated CANH and CANL signals, referred to as CANH_ATTEN and CANL_ATTEN, from the attenuator 414. The PGATE, PDRAIN, NDRAIN and NGATE signals are provided to the CAN bus fault detection circuit 416. An ENABLE signal is provided to the CAN bus fault detection circuit 416. CALIBRATE and CLK5MHz signals are provided to the CAN bus fault detection circuit 416. A TXD or transmit data signal is provided to the CAN bus fault detection circuit 416. The outputs from the CAN bus fault detection circuit 416 include signals of FAULT 0, FAULT 1, FAULT 245, FAULT 3, FAULT 6, FAULT 710, FAULT 811 and FAULT 9 to indicate the various fault conditions that are present. Multiple fault conditions are indicated in a single signal, such as FAULT 245, as the voltage and current measurements being performed cannot distinguish the different fault conditions. In addition, outputs B0-B7 are provided from the CAN bus fault detection circuit 416 to indicate distance from the CAN Bus Transceiver with CAN Bus Fault Detection 354.

Figure 5:
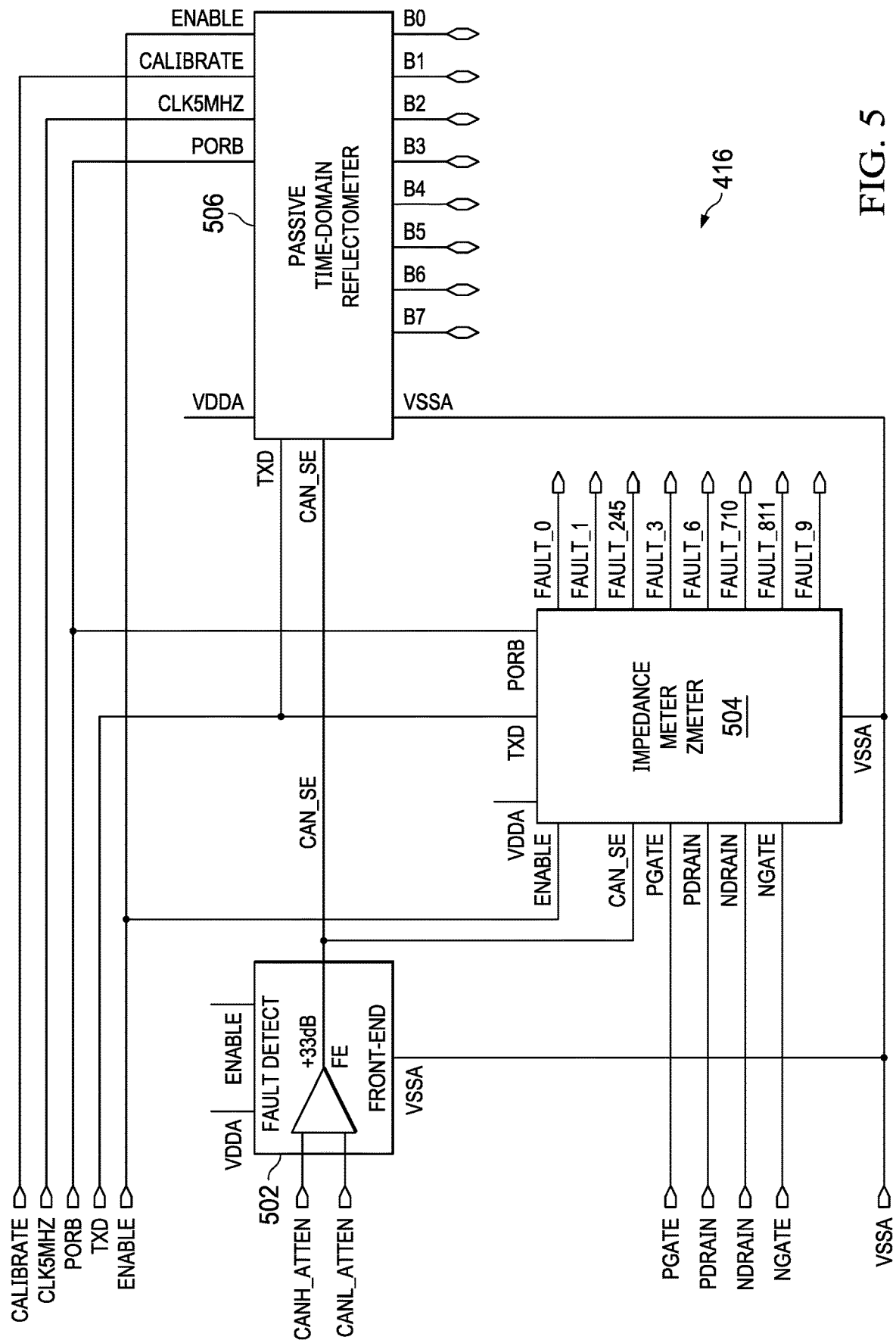
FIG. 5 is a block diagram of portions of the CAN bus fault detection module of FIG. 3.

FIG. 5 is a block diagram of the CAN bus fault detection circuit 416. The CANH_ATTEN and CANL_ATTEN signals are provided to a fault detection front-end module 502 which amplifies the attenuated CAN bus signals to restore signal level. In one design the signal level is amplified by 33 db, which does not return completely to the level of the CAN bus 356 but is large enough to allow detection of the different fault voltages as illustrated previously. The output of the fault detection front-end module 502 is the CAN_SE or single-ended CAN bus differential voltage signal, which is the CANL_ATTEN signal subtracted from the CANH_ATTEN signal. The CAN_SE signal then normally has a low voltage when the CAN bus 356 is in a recessive state and a higher voltage when the CAN bus 356 is in a dominant state. Equating this to the TXD signal, when the CAN Bus fault detection module 354 is providing signals to the CAN bus 356, the CAN_SE signal has a low voltage when the TXD signal is a one or high and a high voltage when the TXD signal is a zero or low. Measurements are taken when the TXD signal is low, as that is when the CAN Bus fault detection module 354 is actively driving the CAN bus 356 to a dominant state. The CAN_SE signal is provided to an impedance meter circuit 504. Other inputs to the impedance meter circuit 504 include the ENABLE input; the PGATE, PDRAIN, NDRAIN and NGATE signals, the TXD signal and a POR or power on signal. The various fault signals described above are provided by the impedance meter circuit 504.

The TXD signal and the CAN_SE signal are provided to a passive time-domain reflectometer circuit 506. The passive time-domain reflectometer circuit 506 receives the CALIBRATE and CLK5MHz signals, the ENABLE signal and the POR signal. Outputs of the passive time-domain reflectometer circuit 506 are the B0-B7 signals.

Figure 6:
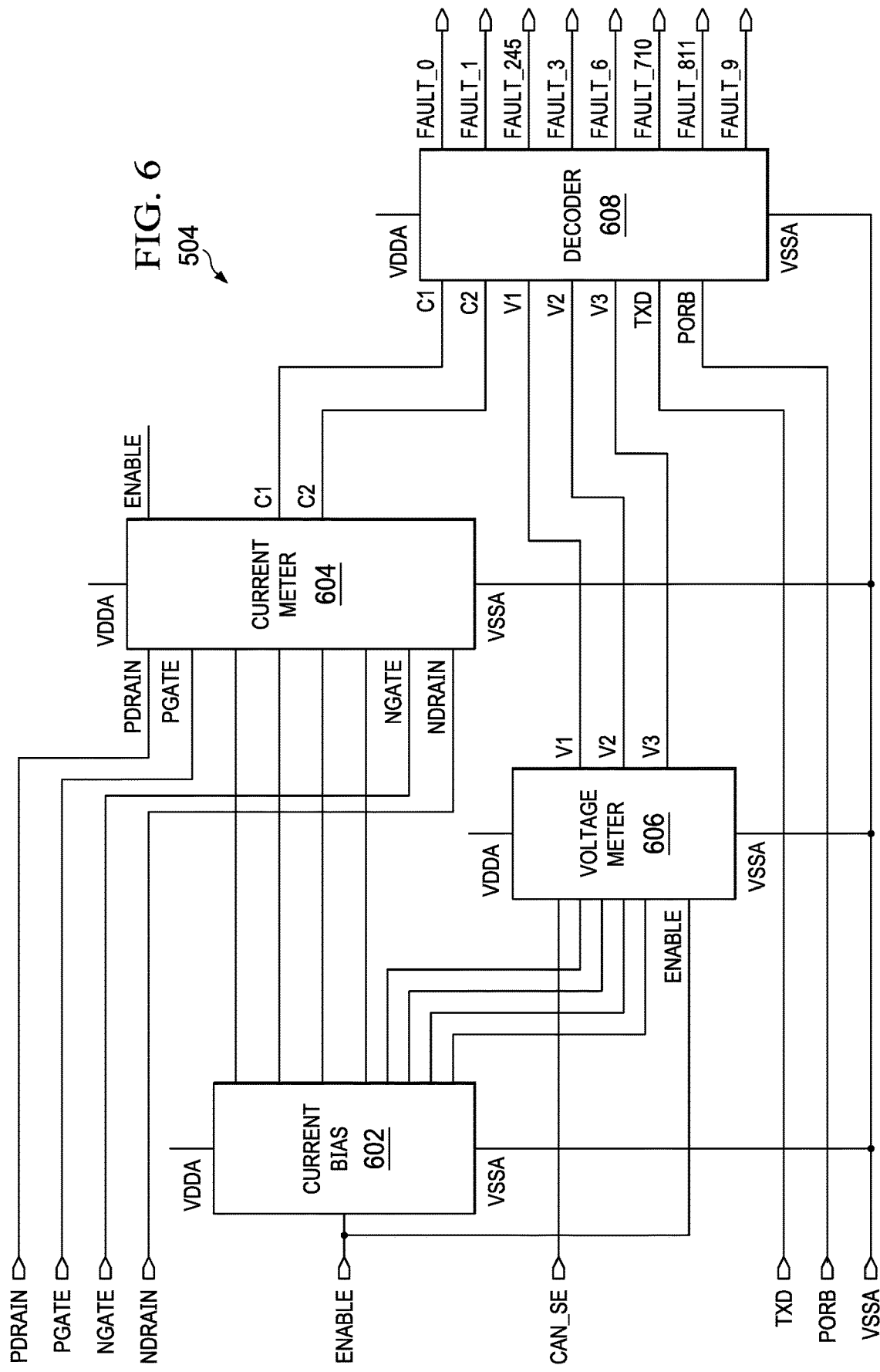
FIG. 6 is a block diagram of the impedance meter of FIG. 5.

FIG. 6 is a block diagram of the impedance meter circuit 504. A current bias circuit 602 provides various exemplary current signals to a current meter circuit 604. The current meter circuit 604 receives the PDRAIN, PGATE, NDRAIN and NGATE signals to monitor the various voltages in the CAN bus 356. Additionally, the reference current signals provided by the current bias circuit 602 are provided to the current meter circuit 604. The ENABLE signal is also provided to the current meter circuit 604. The current meter circuit 604 has two outputs, C1 and C2, which indicate currents of a given range as will be described later.

The current bias circuit 602 also provides three references to a voltmeter circuit 606. The voltmeter circuit 606 receives the ENABLE and CAN—SE signals. The output of the voltmeter circuit 606 are the V1, V2 and V3 signals which are comparator outputs for voltages between desired ranges. The C1, C2, V1, V2 and V3 signals are provided to a decoder 608 which develops the FAULT 0, FAULT 1, FAULT 245, FAULT 3, FAULT 6, FAULT 710, FAULT 811 and FAULT 9 signals from the combination of the signals.

Figure 7:
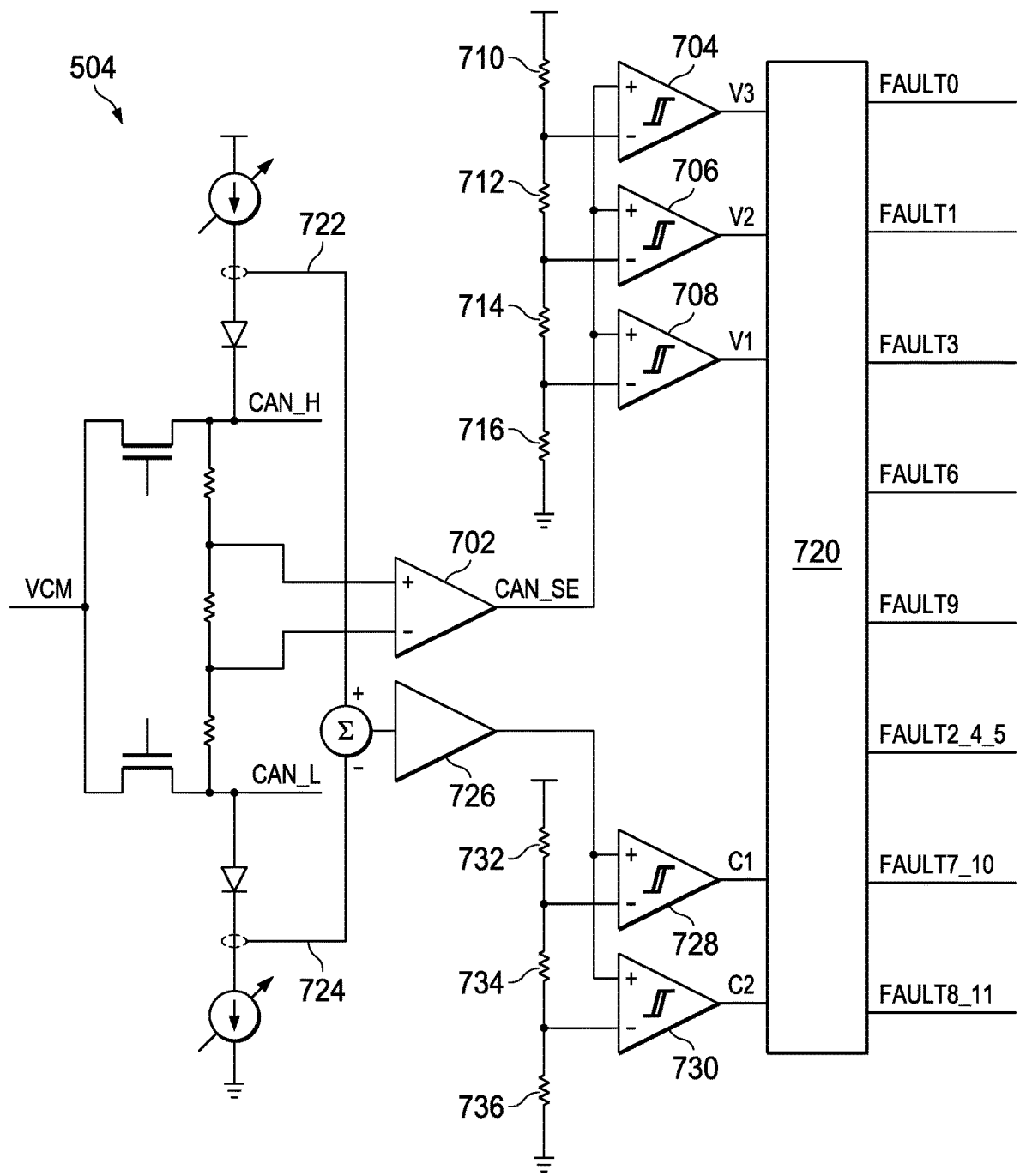
FIG. 7 is a conceptual block diagram of the impedance meter of FIG. 5.

FIG. 7 is a conceptual block diagram of the impedance meter circuit 504. The basic operation of the impedance meter circuit 504 is to measure the current being provided to the CAN bus by the CAN bus transceiver 403 and the voltage levels of the CANH and CANL lines on the CAN bus 356. A differential amplifier 702 measures the voltage difference between the CANH and CANL lines and provides an output equivalent to the CAN_SE signal to three comparators 704, 706 and 708. A resistor divider formed of resistors 710, 712, 714 and 716 provides reference voltages equivalent to the references provided by the current bias circuit 602. In this manner the outputs of the comparators 704, 706 and 708 are the V1, V2 and V3 signals from the voltmeter circuit 606. The comparators 704, 706 and 708 are configured to provide the V3, V2 and V1 signals respectively. In one example, the V3 signal is true for a CAN bus voltage difference greater than 2.95 V, the V2 signal is positive for a CAN bus voltage difference greater than 2.48 V and the V1 signal is positive for a CAN bus voltage difference greater than 0.9 V. These are provided to a decoder 720.

Positive and negative current signals 722 and 724, representing the currents being provided to the CAN bus 356, are summed at an amplifier 726. The amplifier 726 provides an input to comparators 728 and 730. A divider string illustrated as resistors 732, 734 and 736 provide references to the comparators 728 and 730 so that the outputs of the comparators 728 and 730 are the C1 and C2 signals of the current meter circuit 604. The C1 and C2 signals are provided to the decoder 720. The output of the decoder 720 are the FAULT 0, FAULT 1, FAULT 245, FAULT 3, FAULT 6, FAULT 710, FAULT 811 and FAULT 9 signals.

Figure 7A:
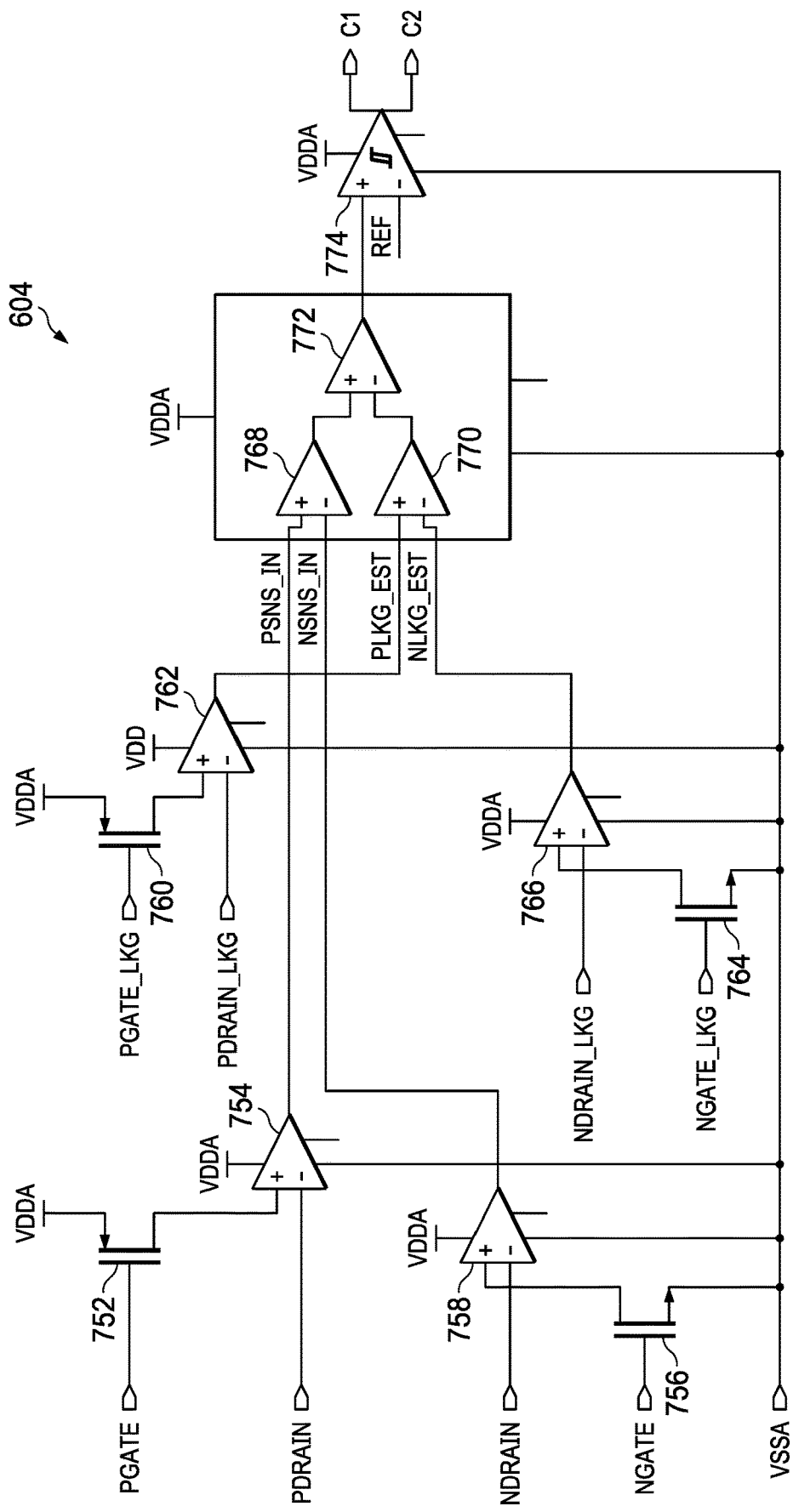
FIG. 7A is a block diagram of the current meter circuit of FIG. 6.

FIG. 7A is a block diagram of the current meter circuit 604. The PGATE signal is provided to the gate of a P-channel enhancement mode MOSFET 752, whose source is connected to $V_{DD}$ and whose drain is connected to the non-inverting input of a P amplifier 754. The PDRAIN signal is provided to the inverting input of the amplifier 754. The output of the amplifier 754 is the PSNS_IN signal, representing the sensed P channel current.

The NGATE signal is provided to the gate of an N-channel enhancement mode MOSFET 756, whose source is connected to $V_{SS}$ and whose drain is connected to the non-inverting input of a N amplifier 758. The NDRAIN signal is provided to the inverting input of the amplifier 758. The output of the amplifier 758 is the NSNS_IN signal, representing the sensed N channel current.

Figure 9:
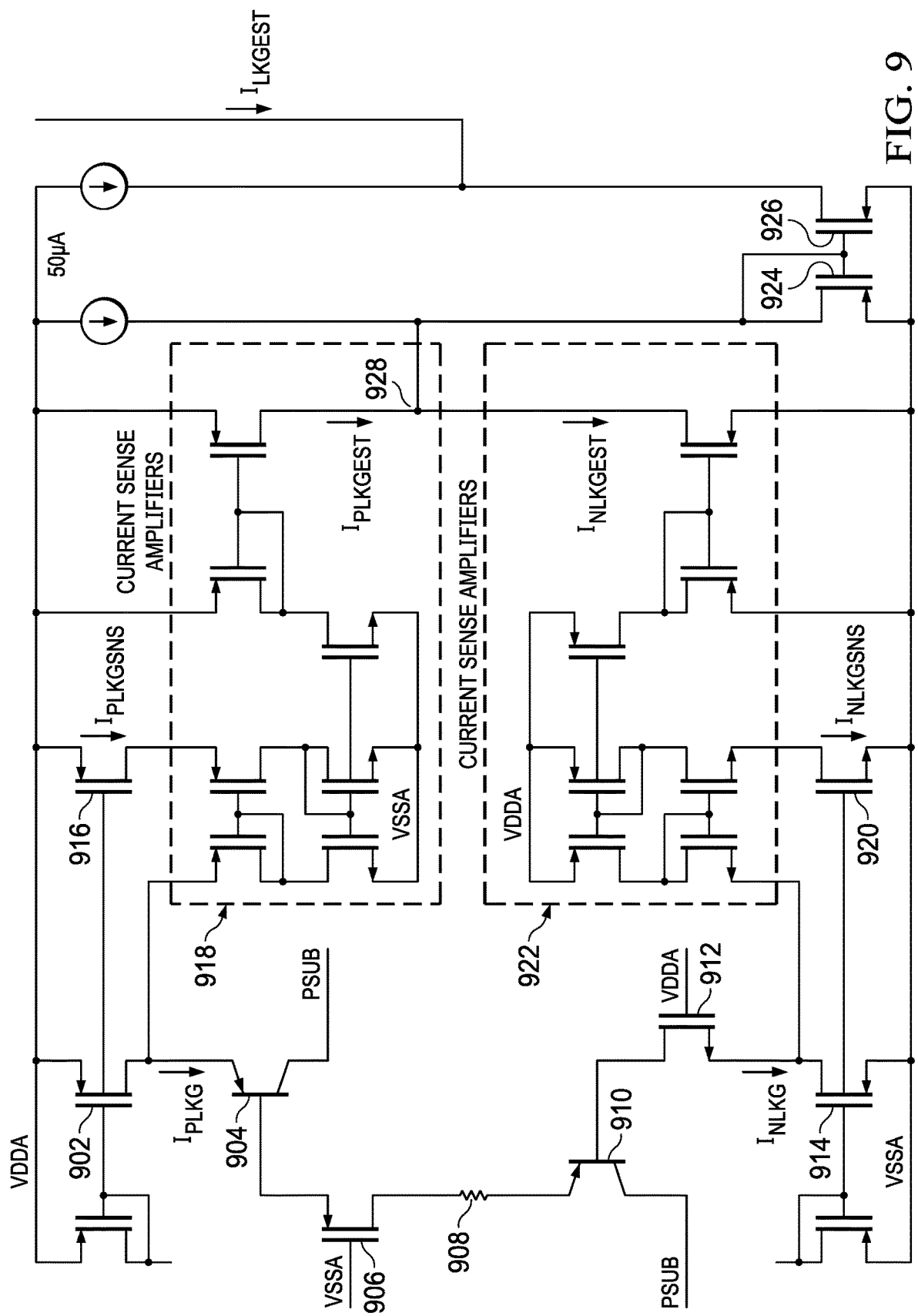
FIG. 9 is a block diagram of portions of the current meter of FIG. 6.
Figure 11:
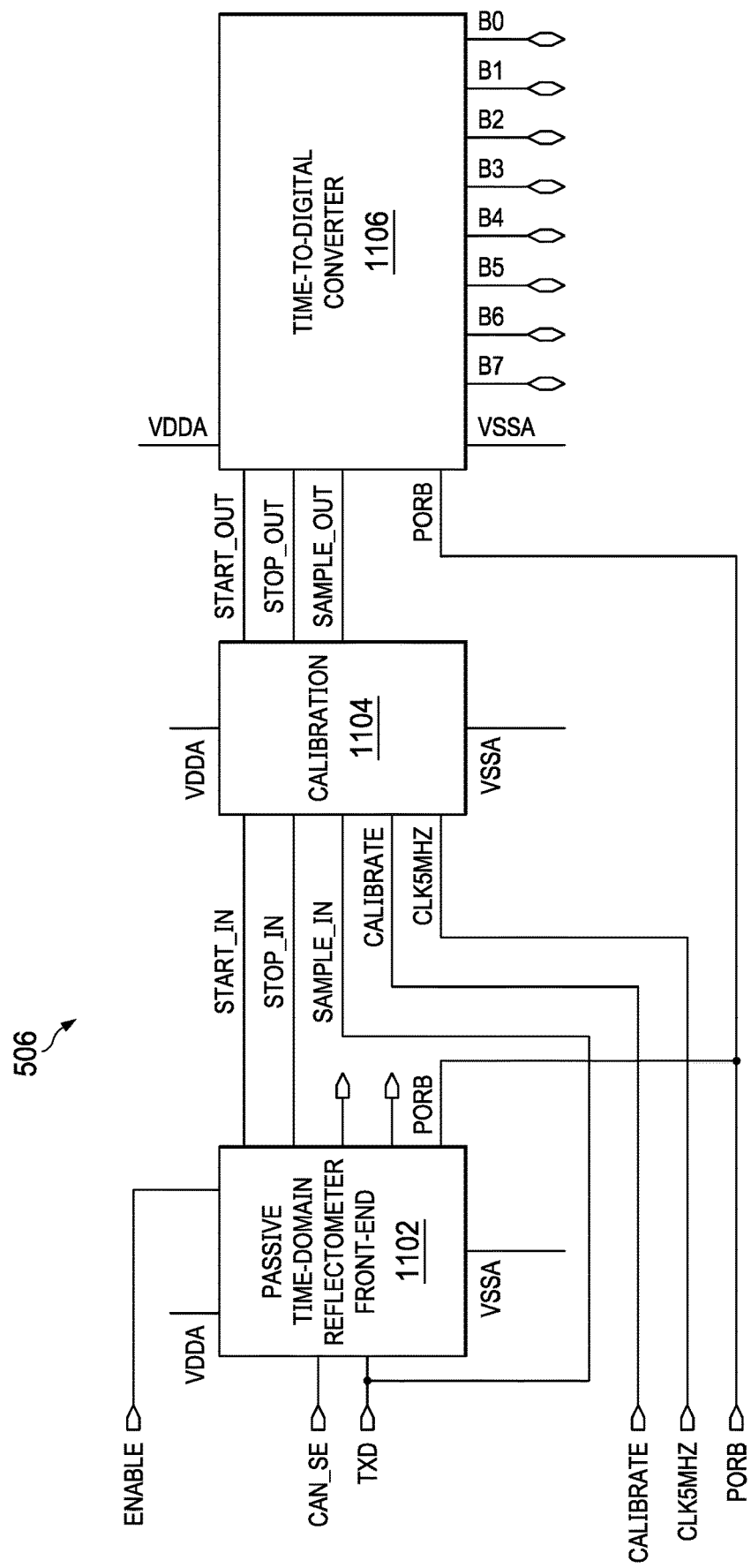
FIG. 11 is a block diagram of a passive time-domain reflectometer of FIG. 5.

Not shown in FIG. 7A but shown in FIG. 9 is a model of the CAN bus to determine leakage currents. A PGATE_LKG signal is provided to the gate of a P-channel enhancement mode MOSFET 760, whose source is connected to $V_{DD}$ and whose drain is connected to the non-inverting input of an amplifier 762. The PDRAIN_LKG signal is provided to the inverting input of the amplifier 762. The output of the amplifier 762 is the PLKG_EST signal, representing the estimated P channel leakage current.

An NGATE_LKG signal is provided to the gate of an N-channel enhancement mode MOSFET 764, whose source is connected to $V_{SS}$ and whose drain is connected to the non-inverting input of an amplifier 766. The NDRAIN_LKG signal is provided to the inverting input of the amplifier 766. The output of the amplifier 766 is the NLKG_EST signal, representing the estimated N channel leakage current.

The PSNS_IN signal is provided to the non-inverting input of an amplifier 768, with the NSNS_IN signal provided to the inverting input of the amplifier 768. The PLKG_EST signal is provided to the non-inverting input of an amplifier 770, with the NLKG_EST signal provided to the inverting input. The output of the amplifier 768 is provided to the non-inverting input of an amplifier 772, with the output of the amplifier 770 provided to the inverting input. With this configuration the estimated leakage current is subtracted from the sensed current. The output of the amplifier 772 is provided to a comparator 774, which receives appropriate reference inputs to provide the C1 and C2 signals as outputs.

Figure 8:
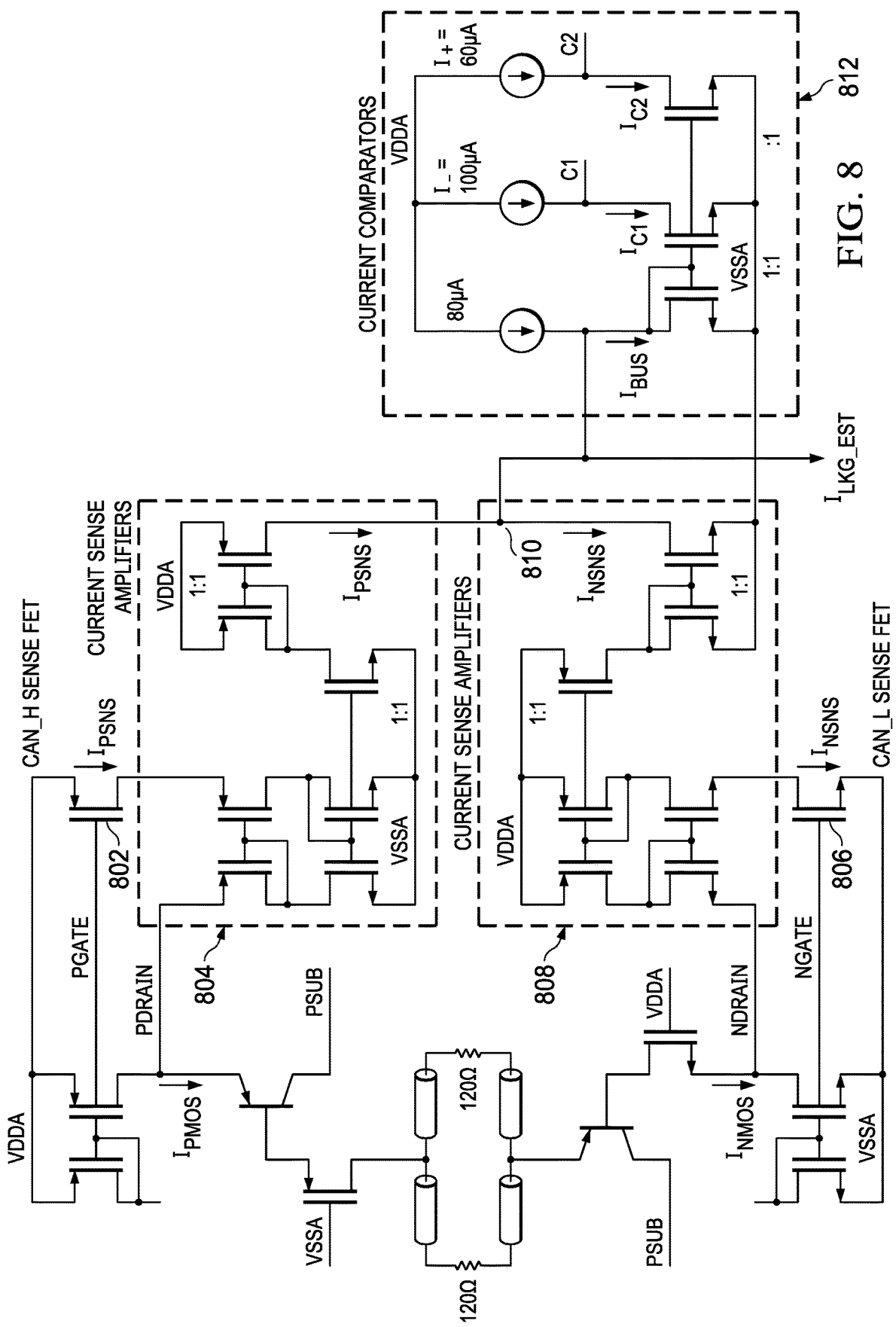
FIG. 8 is a block diagrams of portions of the current meter of FIG. 6.

FIGS. 8 and 9 provide details on the current meter circuit 604. Reference to equivalent portions of FIG. 7A are provided for reference. FIG. 8 illustrates one example of the basic current sense circuitry and comparators, while FIG. 9 provides a correction factor based on estimated leakage currents present in the integrated circuit. The PGATE signal is provided to the gate of a P-channel enhancement MOSFET 802, equivalent to MOSFET 752. The drain of the MOSFET 802 is connected to a P current sense amplifier 804, equivalent to amplifier 754, which thus provides the $I_{PSNS}$ or sensed PMOS current. The PDRAIN signal is provided to the P current sense amplifier 804. The NGATE signal is provided to the gate of an N-channel enhancement MOSFET 806, equivalent to MOSFET 756, whose source is connected to ground. The drain of the MOSFET 806 is connected to an N current sense amplifier 808, equivalent to the amplifier 758, which also receives the NDRAIN signal. The output of the N current sense amplifier 808 is the $I_{NSNS}$ or sensed NMOS current. The connection between the P current sense amplifier 804 and the N current sense amplifier 808 is a summer 810, equivalent to the amplifier 768, which provides the $I_{BUS}$ signal or estimated CAN bus drive current signal.

As the integrated circuit contains leakage, and in some cases the leakage may be appreciable, FIG. 9 provides details of circuitry to perform a leakage current estimate to correct the $I_{BUS}$ signal. A P-channel enhancement MOSFET 902 has the source connected to $V_{DD}$ and the drain connected to the collector of a PNP (p-type n-type p-type) transistor 904. The emitter of the transistor 904 is connected to the substrate. The base of the PNP transistor 904 is connected to the source of a P-channel enhancement MOSFET 906, whose gate is connected to ground and whose drain is connected to a simulation resistor 908. Simulation resistor 908 is used to simulate the nominal impedance of the CAN bus 356. The simulation resistor 908 is connected to the emitter of a PNP transistor 910, whose collector is connected to the substrate. The base of the transistor 910 is connected to the drain of a N-channel enhancement MOSFET 912, whose base is connected to $V_{DD}$. The source of the MOSFET 912 is connected to the drain of an N-channel enhancement MOSFET 914, whose source is connected to $V_{SS}$. In this configuration an $I_{PLKG}$ or PMOS leakage current signal is provided through the transistor 904, while an $I_{NLKG}$ or NMOS leakage current is provided through the MOSFET 912. The MOSFET 902 simulates the MOSFET 408 and the MOSFET 914 simulates the MOSFET 410. These simulated drive transistors and the simulation resistor 908 thus form a simulation of the CAN bus for leakage purposes.

The gate of the MOSFET 902 is connected to the gate of a P-channel enhancement MOSFET 916, equivalent to MOSFET 760, whose source is connected to VDD and whose drain is connected to a leakage P current sense amplifier 918, equivalent to amplifier 762. The P current sense amplifier 918 is also connected to the drain of the MOSFET 902 to provide the leakage current being amplified. The gate of the MOSFET 914 is connected to the gate of an N-channel enhancement MOSFET 920, equivalent to MOSFET 764, whose source is connected to VSS. The drain of the MOSFET 920 is connected to a leakage N current sense amplifier 922, equivalent to amplifier 770, which is also connected to the drain of the MOSFET 914. The connection between the P current sense amplifier 804 and the N current sense amplifier 808 is a summer 810 equivalent to the amplifier 768, which provides the IBUS signal or estimated CAN bus drive current signal.

In this manner $I_{PLKGEST}$ and $I_{NLKGEST}$ currents are produced and summed at the connection 928 between leakage P current sense amplifier 918 and the leakage N current sense amplifier 922, the connection 928 acting as a leakage summer. A differential pair of N-channel enhancement MOSFETs 924 and 926 mirror the difference between the $I_{PLKGEST}$ and $I_{NLKGEST}$ signals and provide an $I_{LKGEST}$ signal or the leakage current estimate.

The $I_{LKGEST}$ signal is connected to the $I_{BUS}$ signal to provide a compensated value for the CAN bus current. A set of current comparators 812, equivalent to comparator 774, receive the $I_{BUS}$ signal that has been corrected by the $I_{LKGEST}$ signal and compares this to preset currents to provide the C1 and C2 signals. The C1 signal indicates a current draw less than 24 mA on the CAN bus, while the C2 signal indicates a current draw greater than −24 mA on the CAN bus.

The V1, V2 and V3 signals and C1 and C2 signals described above are provided to the decoder 608 or 720. FIG. 10 is the logic table for the decoder 608, 720. Referring back to the fault drawings discussed above, FIGS. 2A-2O, the fault conditions are listed, with the V3, V2, V1, C1 and C2 signal levels for that particular fault condition and the FAULT signal provided for each combination. The code value is latched into a register (not shown) based on the rising edge of the TXD signal, so that the values determined while the CAN bus is being driven, when the TXD signal is low, are stored. The register is cleared by the POR signal. The code value indicated in the table is provided as the appropriate of the FAULT 0, FAULT 1, FAULT 245, FAULT 3, FAULT 6, FAULT 710, FAULT 811 and FAULT 9 or fault code output signals which are read by the MCU 352. The MCU 352 provides the fault code to a system technician for fault detection purposes.

Referring now to Figure n, a block diagram of the passive time-domain reflectometer circuit 506 is illustrated. A passive time-domain reflectometer front end circuit 1102 receives the CAN_SE and TXD signals as well as the ENABLE signal. The passive time-domain reflectometer front end circuit 1102 provides START_IN and STOP_IN signals to indicate when to start measuring and when to stop measuring the time period, the START_IN and STOP_IN signals being generated based on the voltage difference on the CAN bus 356. A calibration module 1104 receives the START_IN and STOP_IN signals from the past passive time-domain reflectometer front end circuit 1102, along with the TXD, CALIBRATE and CLK5MHz signals. The outputs of the calibration module 1104 are the START_OUT, STOP_OUT and SAMPLE signals. A time to digital converter circuit nob receives the START_OUT, STOP_OUT and SAMPLE signals and a PORB or power on reset low signal (B on a signal name indicates low true) and performs a timing operation to develop the B0-B7 output signals.

Figure 12:
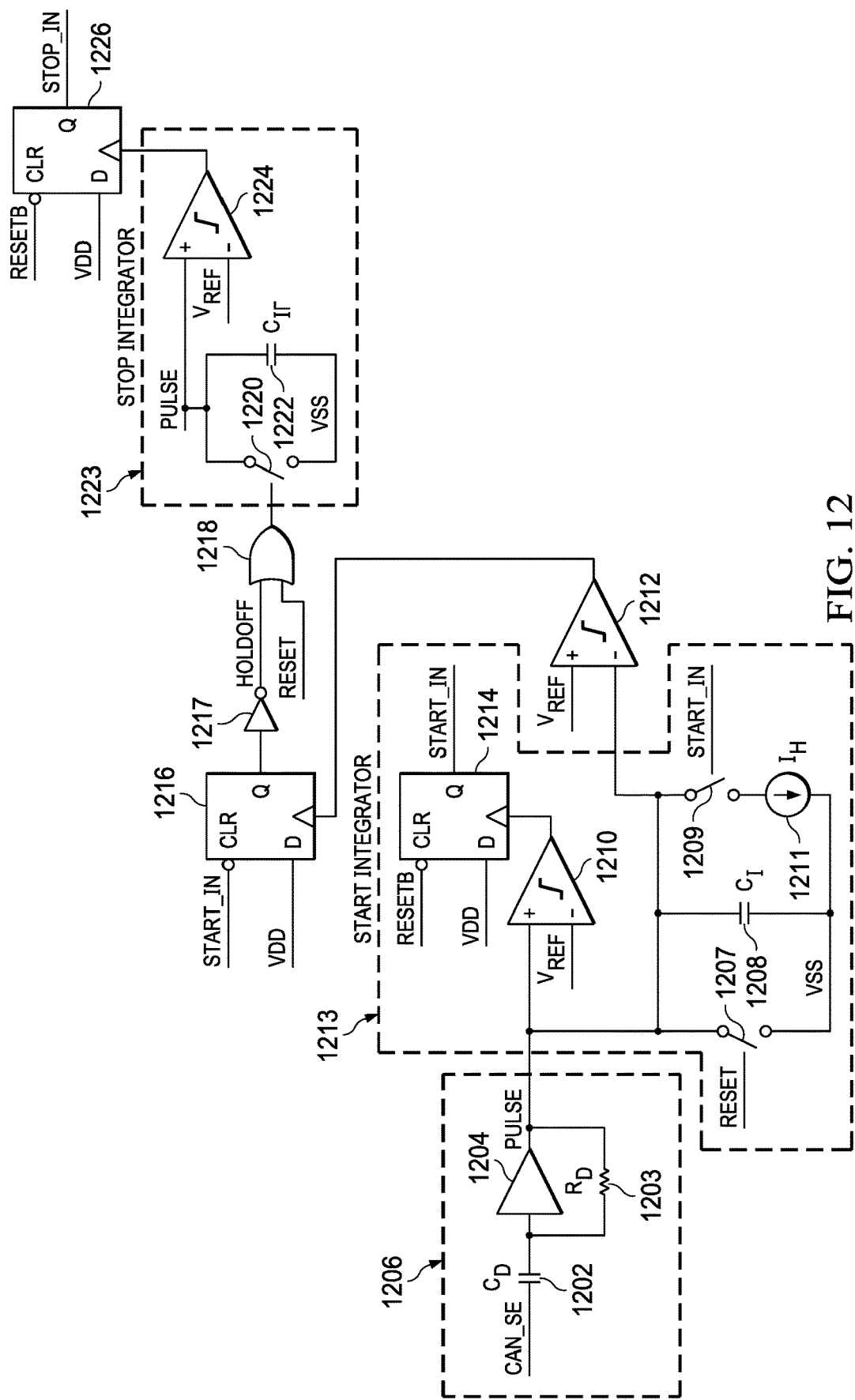
FIG. 12 is a block diagram of the passive time-domain reflectometer front-end of FIG. 11.

FIG. 12 illustrates a detailed block diagram of the passive time-domain reflectometer front end circuit 1102. The CAN_SE signal is provided to a series capacitor 1202, which is also connected to an amplifier 1204. A resistor 1203 is provided from the input to the output of the amplifier 1204. The combination of the capacitor 1202, resistor 1203 and amplifier 1204 form a differentiator 1206 to convert the rising or leading edges of the signals on the CAN bus to pulses, so that a pulse signal is provided as the output of the differentiator 1206. The pulse signal is provided to the noninverting input of a comparator 1210 and to a capacitor 1208 which is connected to ground and to a switch 1207 to ground controlled by the RESET signal. The RESET signal is the TXD signal so that the non-inverting input of the comparator 1210 is held low until a dominant signal is being driven on the CAN bus 356. The inverting input of the comparator 1210 receives a $V_{ref}$ signal set such that when the differentiator 1206 output reaches a level that indicates a valid driven dominant state on the CAN_SE signal indicative of a dominant state being driven, the comparator 1210 provides a rising edge on the output signal. The combination of the capacitor 1208, switch 1207, the switch 1209 and the comparator 1210 act as a START or driven signal integrator 123 to allow determining that the energy of the initial pulse based on the CAN_SE signal indicates a valid driven dominant signal. The output of the comparator 1210 is used to clock a D-type flip-flop 1214 whose output is the START_IN signal to indicate the starting or leading edge of a driven dominant signal on the CAN bus 356. The flip-flop 1214 receives the $V_{DD}$ signal at the D input and a RESETB signal at the clear input. The RESETB signal keeps the flip-flop 1214 output low until a dominant signal is being driven onto the CAN bus 356.

The pulse signal is also provided to a switch 1209 controlled by the START_IN signal and in series with a current source 1211 to ground, both in parallel with the capacitor 1208, and to the inverting input of a comparator 1212. The non-inverting input of the comparator 1212 receives a $V_{ref}$ signal, which is set at a level such that when the capacitor 1208 is discharged based on the current source 1211, a given amount of time has passed to allow the leading edge of the dominant signal to pass. The output of the comparator 1212 is provided to the clocking input of a D-type flip-flop 1216. The flip-flop 1216 is cleared by the START_IN signal, so that the flip-flop 1216 output remains low until the START_IN signal is present. The output of the flip-flop 1216 is inverted by an inverter 1217 and provided to one input of an OR gate 1218 as a HOLDOFF signal, to allow time for the leading or driven edge of the dominate signal to clear. The other input to the OR gate 1218 is the RESET signal so that the output remains high until a dominant signal is being driven.

The output of the OR gate 1218 is provided to a switch 1220 to ground, which is in parallel with a capacitor 1222. The pulse signal is provided to the switch 1220 and the capacitor 1222 and to the noninverting input of a comparator 1224. The switch 1220, capacitor 1222 and the comparator 1224 act as a STOP or reflected signal integrator 1223, to determine when the second pulse detected, the reflection-based pulse, is sufficient for a valid determination. The inverting input of the comparator 1224 receives a $V_{ref}$ signal to set the required energy level to indicate a valid reflected signal. The output of the comparator 1224 is provided to the clock input of a D-type flip-flop 1226. The clear input of the flip-flop 1226 receives the RESETB signal to keep the output cleared until a dominant signal is being driven, while the D input receives the $V_{DD}$ signal. The output of the D-type flip-flop 1226 is the STOP_IN signal which indicates the beginning or leading edge of the reflected signal, so that timing can be stopped. In this manner the leading edge of the driven dominant CAN bus signal produces the START_IN signal, while the leading edge of the reflected signal produces the STOP_IN signal, thus timing the driven to reflected signals on the CAN bus.

Figure 13:
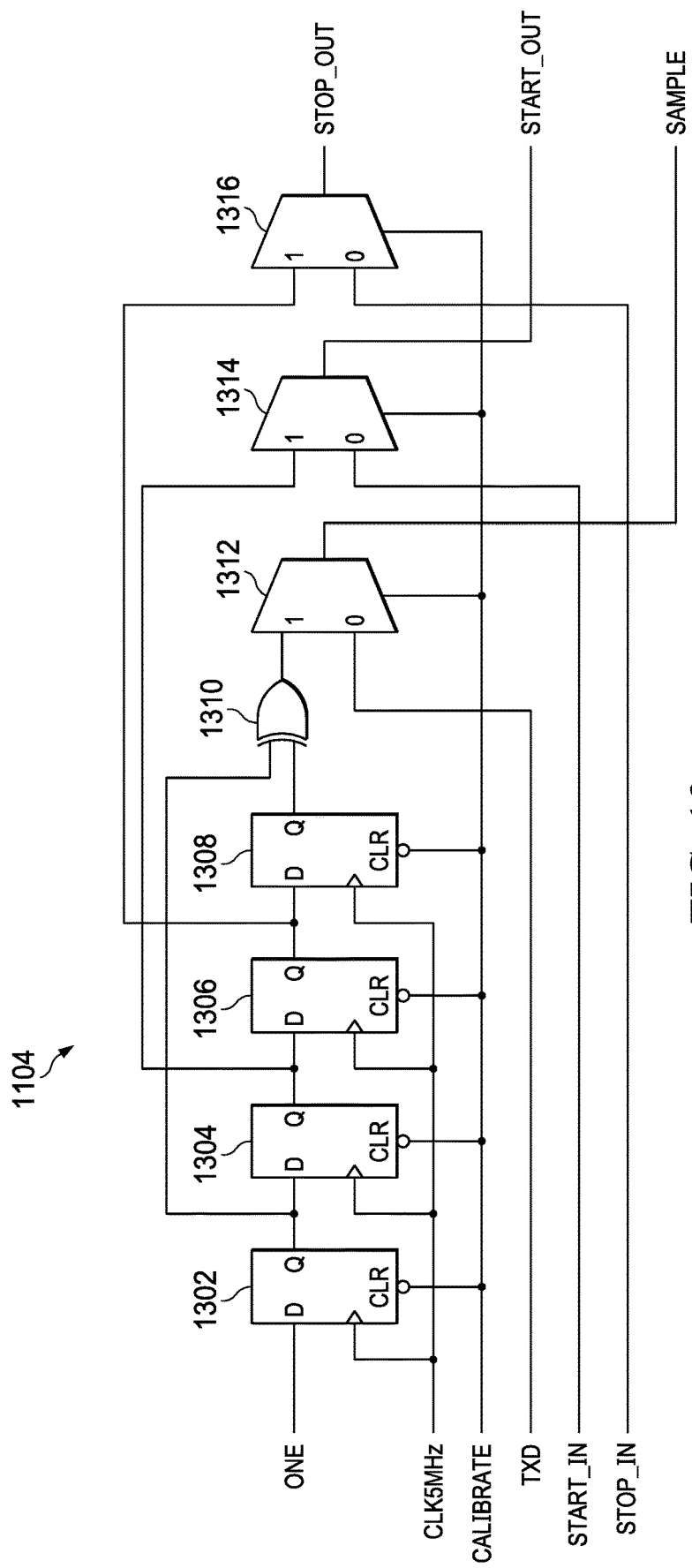
FIG. 13 is a block diagram of the calibration module of FIG. 11.

The START_IN, STOP_IN, CLK5MHz, TXD and CALIBRATE signals are provided to the calibration circuit or module 1104 illustrated in FIG. 13. The CLK5MHz signal is used in one design to clock a series of D-type flip-flops 1302, 1304, 1306 and 1308. The CALIBRATE signal is provided to the clear input of each of the flip-flops 1302, 1304, 1306 and 1308. A one value is provided to the D input of the flip-flop 1302. The output of the flip-flop 1302 is provided to the D input of the flip-flop 1304. The output of the flip-flop 1304 is provided to the D input of the flip-flop 1306. The output of the flip-flop 1306 is provided to the D input of the flip-flop 1308. The outputs of the flip-flops 1302 and 1308 are provided as the inputs to an XOR gate 1310.

A series of multiplexers 1312, 1314 and 1316 have the CALIBRATE signal provided to the select input. The output of the XOR gate 1310 is provided to the 1 input of the multiplexer 1312, with the TXD signal provided to the 0 input. The output of the multiplexer 1312 is the SAMPLE signal. The output of the flip-flop 1304 is provided to the 1 input of the multiplexer 1314, with the START_IN signal provided to the 0 input. The output of the multiplexer 1314 is the START_OUT signal. The output of the flip-flop 1306 is provided to the 1 input of the multiplexer 1316, with the STOP_IN signal provided to the 0 input. The output of the multiplexer 1316 is the STOP_OUT signal.

With this configuration, when not performing a calibration, the incoming START_IN, STOP_IN and TXD signals are provided as the START_OUT, STOP_OUT and SAMPLE signals. When performing a calibration, the 5 MHz clock is used to synthesize SAMPLE, START_OUT and STOP_OUT simulated signals in the correct relationship and a period that can be measured by the time-to-digital converter circuit 1106.

Figure 14:
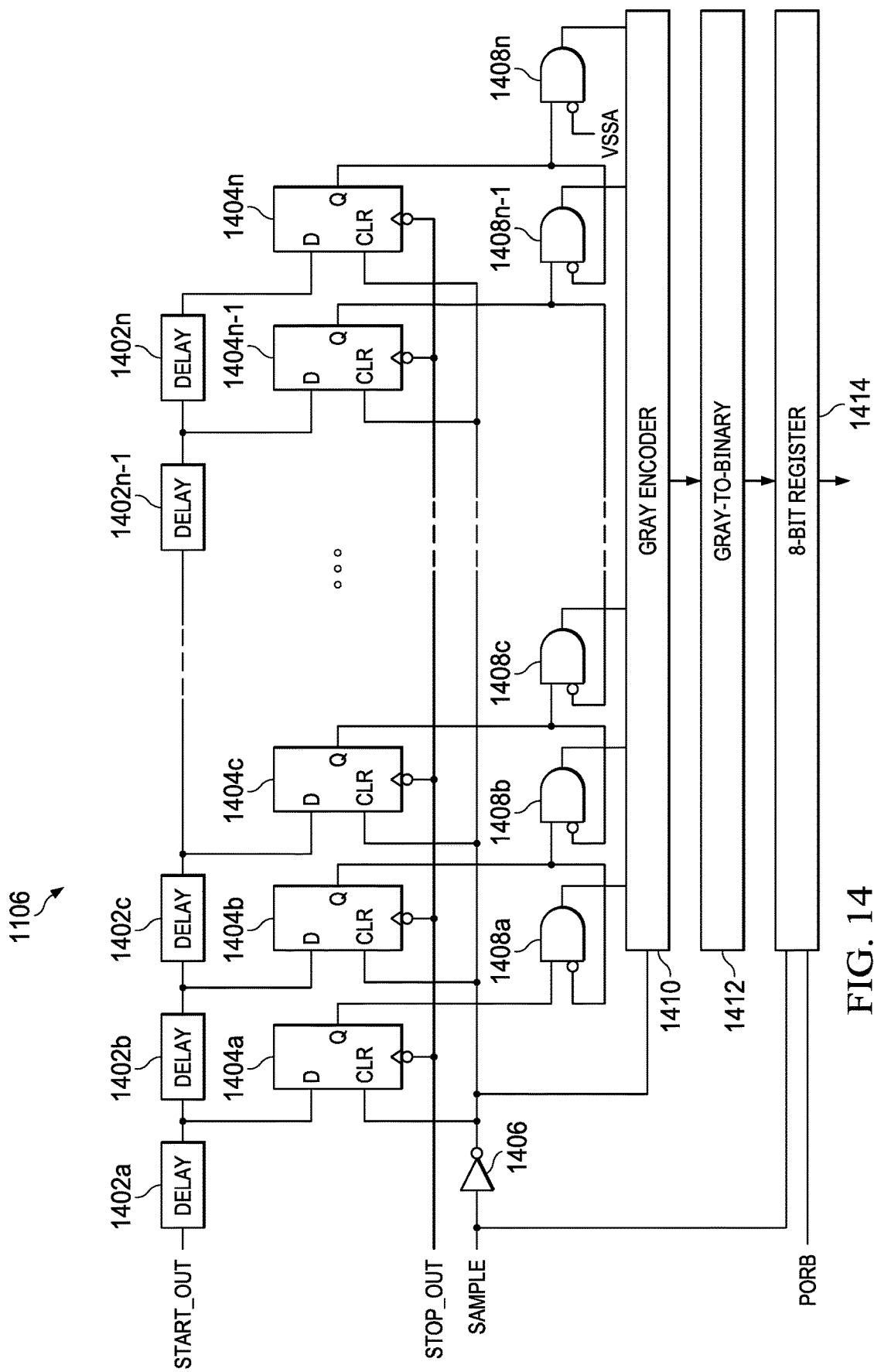
FIG. 14 is a block diagram of the time-to-digital converter of FIG. 11.

FIG. 14 illustrates details of the time to digital converter circuit 106, which is a timer that times the period between the START_OUT and STOP_OUT signals and provides a digital output time value. The START_OUT signal is provided to a series of delay elements 1402a, 1402b, 1402c . . . 1402n-1, 1402n arranged in series. In one design there are 256 delay elements and each delay element has a period of 1.67 ns, for a total possible delay of 426 ns. The output of each delay element 1402a-1402n is provided to the D input of a series of D-type flip-flops 1404a, 1404b, 1404c, . . . 1404n-1, 1404n. The STOP_OUT signal is used to clock the flip-flops 1404a-1404n. The SAMPLE signal is provided to an inverter 1406, whose output is provided to the clear input of the flip-flops 1404a-1404n. In this way the outputs of the flip-flops 1404a-1404n are cleared until it is time to sample a particular waveform. This configuration results in thermometer encoding of the delay line, where the outputs up to the latest delay element to output a one value are ones.

The output of each flip-flop 1404a-1404n is provided as one input to an AND gate 1408a-1408n. The second input of the AND gates 1408a-1408n-1 is the inverted output of the next stage flip-flop 1404b-1404n. The second input of the AND gate 1408n is a one value. This AND gate configuration converts the thermometer encoding of the flip-flops 1404a-1404n to a one hot encoding, where only the AND gate related to the delay element that has just turned to a one value provides a one output, the other AND gates having a zero output. The outputs of the AND gates 1408a-1408n are provided to a gray encoder 1410, whose outputs are provided to a gray-to-binary encoder 1412, whose output is provided to an 8-bit register 1414. The register 1414 provides the B0-B7 signals that indicate the time value in ns between the transmitted signal and the reflected signal. This time value is then converted to a distance value by the MCU 352, which distance value can be provided to a system technician for fault detection purposes. If calibration is being performed, this value will represent one clock of the CLK5MHz signal, basically 200 ns.

The CAN bus fault detection circuitry is shown as integrated with the CAN bus transceiver circuitry on a single integrated circuit. This integration allows simple access to the transistors driving the CAN bus and used for current determinations. In other designs the CAN bus fault detection circuitry is provided in a separate integrated circuit which includes its own CAN bus drive circuitry, with simulated CAN bus signals driven when measurements are to be performed. The separate CAN bus fault detection circuitry monitors the CAN bus for an appropriate period when no other devices are driving the CAN bus to drive measurement signals onto the CAN bus. The controlling MCU provides a signal to the separate CAN bus fault detection circuitry when a fault determination is desired.

By using the voltage and current measurements of the CAN bus, a fault type is determined. Using the time-domain reflectometer monitoring the CAN bus signals, a distance to the fault is determined. Either or both values are provided to a service technician to allow error determination and correction.

The above description is intended to be illustrative, and not restrictive. For example, the above-described examples may be used in combination with each other. Many other examples will be upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A control area network (CAN) bus integrated circuit comprising:
CAN bus high and low terminals;
a CAN bus high drive transistor coupled to the CAN bus high terminal;
a CAN bus low driver transistor coupled to the CAN bus low terminal;
an amplifier coupled to the CAN bus high and low terminals and providing a CAN bus differential voltage signal as an output;
voltmeter comparators receiving the CAN bus differential voltage signal and including comparators, to monitor the CAN bus differential voltage signal and provide output signals, each output signal indicating a different voltage level of the CAN bus differential voltage signal is present;
a P amplifier connected to the CAN bus high drive transistor to determine current through the CAN bus high drive transistor;
an N amplifier connected to the CAN bus low drive transistor to determine current through the CAN bus low drive transistor;
a summer coupled to the P amplifier and the N amplifier to subtract the current through the CAN bus low drive transistor from the current through the CAN bus high drive transistor to develop a CAN bus drive current;
current meter comparators coupled to the summer and including a comparators, to monitor the CAN bus drive current and provide outputs signals, each output signal indicating a different drive current level of the CAN bus is present; and
a decoder coupled to the voltmeter comparators output signals and the current meter comparators outputs to decode the voltmeter comparators and the current meter comparators outputs to provide a fault code output.

2. The CAN bus integrated circuit of claim 1, further comprising:
a CAN bus load simulation circuit including a simulation high drive transistor and a simulation low drive transistor;
a leakage P amplifier connected to the simulation high drive transistor to determine current through the simulation high drive transistor;
a leakage N amplifier connected to the simulation low drive transistor to determine current through the simulation low drive transistor; and
a leakage summer coupled to the leakage P amplifier and the leakage N amplifier to subtract the current through the simulation low drive transistor from the current through the simulation high drive transistor to determine a leakage current, the leakage summer having an output coupled to the summer,
wherein the summer subtracts the leakage current from the CAN bus drive current.

3. The CAN bus integrated circuit of claim 1, further comprising:
a transmit data signal terminal,
wherein the decoder is coupled to the transmit data signal terminal to latch a decoded voltmeter comparators output signals and current meter comparators output signals value to provide the fault code output.

4. The CAN bus integrated circuit of claim 1, wherein the voltmeter comparators includes three comparators.

5. The CAN bus integrated circuit of claim 1, wherein the current meter comparators includes two comparators.

6. The CAN bus integrated circuit of claim 5, wherein the voltmeter comparators includes three comparators, and
wherein the decoder provides eight different fault code values at the fault code output.

7. A control area network (CAN) bus integrated circuit comprising:
CAN bus high and low terminals;
a transmit data signal terminal;
an amplifier coupled to the CAN bus high and low terminals and providing a CAN bus differential voltage signal as an output;
a differentiator coupled to the amplifier to determine leading edges of signals on the CAN bus from the CAN bus differential voltage signal;
a driven signal integrator coupled to the differentiator to determine a valid driven signal leading edge on the CAN bus and provide an output to indicate the valid driven signal leading edge;
a reflected signal integrator coupled to the differentiator to determine a valid reflected signal leading edge on the CAN bus and provide an output to indicate the valid reflected signal leading edge; and
a timer coupled to the driven signal integrator and the reflected signal integrator and to the transmit data signal terminal to time the difference between the valid driven signal leading edge and the valid reflected signal leading edge and provide a digital output time value of the difference.

8. The CAN bus integrated circuit of claim 7, further comprising:
a calibration circuit coupled to the timer, to the driven signal integrator and the reflected signal integrator and to the transmit data signal terminal and receiving clock and calibration signals, the calibration circuit providing outputs of the driven signal integrator and the reflected signal integrator and to the transmit data signal terminal to the timer when the calibration signal is in a first state and providing simulated values for the valid driven signal leading edge, valid reflected signal leading edge and transmitted data signal to the timer when the calibration signal is in a second state.

9. The CAN bus integrated circuit of claim 7, wherein the timer includes delay elements arranged in series, the first delay element receiving the valid driven signal leading edge indication.

10. The CAN bus integrated circuit of claim 9, wherein the timer further includes flip-flops coupled to the delay elements, each flip-flop receiving a data input from a respective delay element, each flip-flop clocked by the valid reflected signal leading edge indication.

11. The CAN bus integrated circuit of claim 10, wherein the timer further includes AND gates coupled to the flip-flops, each AND gate receiving one input from a respective flip-flop and all but the last AND gate receiving one input from the next flip-flop.

12. The CAN bus integrated circuit of claim 11, wherein the timer further includes a gray encoder coupled to the AND gates to convert the outputs of the AND gates into a gray code.

13. The CAN bus integrated circuit of claim 12, wherein the timer further includes a gray code to binary code converter coupled to the gray encoder to convert the output of the gray encoder to a binary value output.

14. The CAN bus integrated circuit of claim 13, wherein the timer further includes a register coupled to the gray code to binary code converter and to the transmit data signal terminal to latch the binary value output of the gray code to binary code converter to provide a time value output.

15. A control area network (CAN) bus integrated circuit comprising:
CAN bus high and low terminals;
a transmit data signal terminal;
a CAN bus high drive transistor coupled to the CAN bus high terminal;
a CAN bus low driver transistor coupled to the CAN bus low terminal;
an amplifier coupled to the CAN bus high and low pins and providing a CAN bus differential voltage signal as an output;
voltmeter comparators receiving the CAN bus differential voltage signal and including comparators, to monitor the CAN bus differential voltage signal and provide outputs signals, each output signal indicating a different voltage level of the CAN bus differential voltage signal is present;
a P amplifier connected to the CAN bus high drive transistor to determine current through the CAN bus high drive transistor;
an N amplifier connected to the CAN bus low drive transistor to determine current through the CAN bus low drive transistor;
a summer coupled to the P amplifier and the N amplifier to subtract the current through the CAN bus low drive transistor from the current through the CAN bus high drive transistor to develop a CAN bus drive current;
current meter comparators coupled to the summer and including comparators, to monitor the CAN bus drive current and provide outputs signals, each output signal indicating a different drive current level of the CAN bus is present;
a decoder coupled to the voltmeter comparators output signals and the current meter comparators output signals to decode the voltmeter comparators and the current meter comparators output signals to provide a fault code output;
a differentiator coupled to the amplifier to determine leading edges of signals on the CAN bus from the CAN bus differential voltage signal;
a driven signal integrator coupled to the differentiator to determine a valid driven signal leading edge on the CAN bus and provide an output to indicate the valid driven signal leading edge;
a reflected signal integrator coupled to the differentiator to determine a valid reflected signal leading edge on the CAN bus and provide an output to indicate the valid reflected signal leading edge; and
a timer coupled to the driven signal integrator and the reflected signal integrator and to the transmit data signal pin to time the difference between the valid driven signal leading edge and the valid reflected signal leading edge and provide a digital output time value of the difference.

16. The CAN bus integrated circuit of claim 15, further comprising:
a CAN bus load simulation circuit including a simulation high drive transistor and a simulation low drive transistor;
a leakage P amplifier connected to the simulation high drive transistor to determine current through the simulation high drive transistor;
a leakage N amplifier connected to the simulation low drive transistor to determine current through the simulation low drive transistor; and
a leakage summer coupled to the leakage P amplifier and the leakage N amplifier to subtract the current through the simulation low drive transistor from the current through the simulation high drive transistor to determine a leakage current, the leakage summer having an output coupled to the summer,
wherein the summer subtracts the leakage current from the CAN bus drive current.

17. The CAN bus integrated circuit of claim 15, wherein the decoder is coupled to the transmit data signal pin to latch decoded the voltmeter comparators output signals and current meter comparators output signals value to provide the fault code output.

18. The CAN bus integrated circuit of claim 15 wherein the current meter comparators includes two comparators,
wherein the voltmeter comparators includes three comparators, and
wherein the decoder provides eight different fault code values at the fault code output.

19. The CAN bus integrated circuit of claim 15, further comprising:
a calibration circuit coupled to the timer, to the driven signal integrator and the reflected signal integrator and to the transmit data signal terminal and receiving clock and calibration signals, the calibration circuit providing outputs of the driven signal integrator and the reflected signal integrator and to the transmit data signal terminal to the timer when the calibration signal is in a first state and providing simulated values for the valid driven signal leading edge, valid reflected signal leading edge and transmitted data signal to the timer when the calibration signal is in a second state.

20. The CAN bus integrated circuit of claim 15, wherein the timer includes:
   delay elements arranged in series, the first delay element receiving the valid driven signal leading edge indication;
   flip-flops coupled to the delay elements, each flip-flop receiving a data input from a respective delay element, each flip-flop clocked by the valid reflected signal leading edge indication;
   AND gates coupled to the flip-flops, each AND gate receiving one input from a respective flip-flop and all but the last AND gate receiving one input from the next flip-flop;
   a gray encoder coupled to the AND gates to convert the outputs of the plurality of AND gates into a gray code;
   a gray code to binary code converter coupled to the gray encoder to convert the output of the gray encoder to a binary value output; and
   a register coupled to the gray code to binary code converter and to the transmit data signal terminal to latch the binary value output of the gray code to binary code converter to provide a time value output.

* * * * *